(12) United States Patent
Hiraoka et al.

(10) Patent No.: US 6,391,471 B1
(45) Date of Patent: May 21, 2002

(54) FUNCTIONAL DEVICE AND MULTI-COMPONENT MULTI-PHASE TYPE POLYMERIC SHAPED MATERIAL

(75) Inventors: Toshiro Hiraoka, Yokohama; Koji Asakawa, Kawasaki, both of (JP)

(73) Assignee: Kabushiki Kaisha Toshiba, Kabushiki (JP)

( * ) Notice: Subject to any disclaimer, the term of this patent is extended or adjusted under 35 U.S.C. 154(b) by 0 days.

(21) Appl. No.: 09/536,684

(22) Filed: Mar. 28, 2000

(30) Foreign Application Priority Data

Mar. 29, 1999 (JP) .............................. 11-087094

(51) Int. Cl.$^7$ .......................... H01L 29/06; B32B 15/08
(52) U.S. Cl. ...................... 428/623; 428/624; 428/626; 428/620
(58) Field of Search ................................ 428/623, 624, 428/626, 620

(56) References Cited

U.S. PATENT DOCUMENTS 5,563,424 A    10/1996   Yang et al.

OTHER PUBLICATIONS

J. J. M. Halls, et al., Nature, vol. 376, pp. 498–500, "Efficient Photodiodes from Interpenetrating Polymer Networks", Aug. 10, 1995.

G. Yu, et al., Science, vol. 270, pp. 1789–1791, "Polymer Photovoltaic Cells: Enhanced Efficiencies via a Network of Internal Donor-Acceptor Heterojunctions", Dec. 15, 1995.

Y. Yang, et al., Nature, vol. 372, pp. 344–346, "A New Architecture for Polymer Transistors", Nov. 1994.

*Primary Examiner*—James J. Seidleck
*Assistant Examiner*—Olga Asinovsky
(74) *Attorney, Agent, or Firm*—Oblon, Spivak, McClelland, Maier & Neustadt, P.C.

(57) ABSTRACT

The present invention provides a multi-component multi-phase type polymeric shaped material in which a plurality of hole- or electron-conducting phases constitute a three-dimensional bicontinuous nano phase separation structure, and a functional device using the same. Such a functional device is quick in response and good in durability. The present invention also relates to a functional device comprising a laminated structure composed of a plurality of layers laminated, and at least one pair of electrodes that penetrate the interface between two layers laminated.

23 Claims, 2 Drawing Sheets

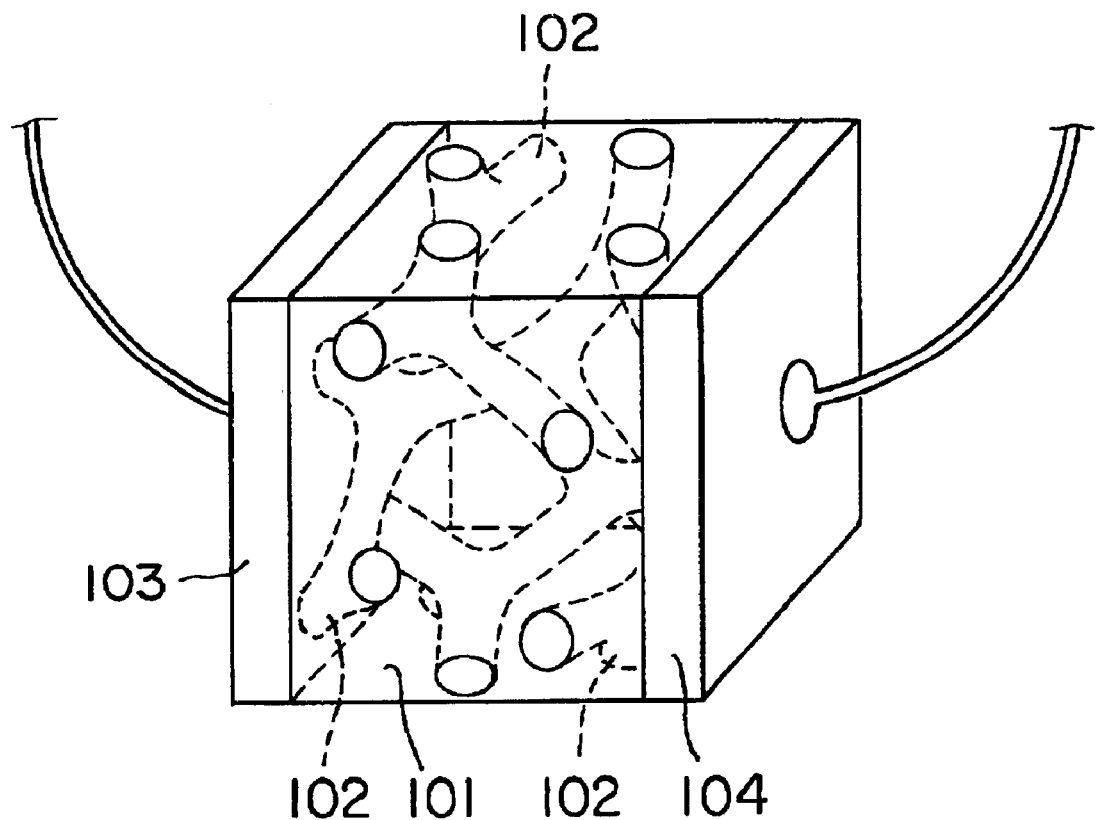
F I G. 1

FUNCTIONAL DEVICE AND MULTI-COMPONENT MULTI-PHASE TYPE POLYMERIC SHAPED MATERIAL

BACKGROUND OF THE INVENTION

1. Field of the Invention

The present invention relates to multi-component multi-phase type polymeric shaped materials that use conducting polymeric compounds, and to functional devices using the same. The present invention is applicable to those devices using conducting polymeric compounds, such as solar batteries, photoelectric conversion devices, light-emitting devices, displays, optical modulation devices, organic FET devices, capacitors, and various sensor devices.

2. Background Art

Semiconducting or conducting polymers, such as conjugated polymers, are excellent in processability, for instance, they can readily be made into thin films. They are therefore promising materials for use in a variety of functional devices such as photoelectric conversion devices, FET devices and light-emitting devices. In these functional devices, there exist various types of interfaces such as an interface of semiconductor-semiconductor type, and an interface of semiconductor-conductor type. The functional devices can fulfil their functions when carriers such as holes or electrons pass through such an interface, or mutually interact at the interface. To allow such functional devices to fulfil their functions more fully, it is important that they have large interfacial areas and that phases or layers contained in them are in close contact at the interface between them. It is however difficult to make the interfacial area large. Moreover, the phases or layers tend to deteriorate or separate at the interface between them because an electric field or stress is severely applied to the interface in many cases. For this reason, the above-described functional devices undergo lowering of durability due to the deterioration of the interfaces, or decrease in speed of response or output power due to their interfacial areas that are not sufficiently large. U.S. Pat. No. 5,563,424 discloses such a technique that a three-dimensional bicontinuous phase separation structure obtainable from a composition that is a blend of polymers is utilized in order to obtain an increased interfacial area. The interfacial area can surely be increased to some extent by the use of this technique. However, the composition for use in this technique is a blend system, so that two phases in the system are not chemically bonded but merely in contact with each other at the interface between them. Therefore, the two phases tend to separate at the interface between them, bringing about deterioration of performance, such as lowering of durability.

As mentioned above, in a variety of functional devices, interfaces that are formed in the devices do not have sufficiently large areas, and are poor in durability. Therefore, the devices have not fully fulfilled their functions.

Under the foregoing circumstances, there have been demanded a functional device having a device structure in which phases are chemically bonded at the interface between them, and the interface has a sufficiently large area, and is extremely good in durability; and a multi-component multi-phase type polymeric shaped material for use in such a functional device.

SUMMARY OF THE INVENTION

A first functional device of the present invention comprises a multi-component multi-phase type polymeric shaped material containing, at least, chains A and B that are hole- or electron-conducting polymer chains, wherein a phase A that is an aggregate of the chains A and a phase B that is an aggregate of the chains B constitute a three-dimensional bicontinuous nano phase separation structure, and, at the same time, are chemically bonded at the interface between them, and has such a device structure that electrode terminals are respectively connected to the phase A and the phase B.

A second functional device of the present invention comprises, at least, hole- or electron-conducting phases A and B, wherein the phase A and the phase B constitute at least one three-dimensional bicontinuous phase separation structure selected from the group consisting of OBDD structures (ordered-bicontinuous double-diamond structures) and Gyroid structures, and has such a device structure that electrode terminals are respectively connected to the phase A and the phase B.

A third functional device of the present invention comprises a laminated structure in which hole-, electron, or ion-conducting phases A and B in sheet form are alternately laminated, and has such a device structure that at least one pair of electrodes are disposed so that they interpenetrate into the laminated structure at 4 points or more, and, at the same time, penetrate the interface between the phases A and B laminated.

A multi-component multi-phase type polymeric shaped material of the present invention comprises, at least, chains A and B that are hole- or electron-conducting polymer chains, wherein a phase A that is an aggregate of the chains A and a phase B that is an aggregate of the chains B constitute a three-dimensional bicontinuous nano phase separation structure, and, at the same time, are chemically bonded at the interface between them.

The present invention can provide functional devices that are quick in response and good in durability. Further, since a device structure equivalent to a laminated structure composed of thin films can be made from a polymeric material comprising a block or graft copolymer, by subjecting it to self-developing structure formation, it is possible to simplify the process of producing functional devices. The present invention is thus effective in reducing the production cost. Furthermore, since hole- or electron-conducting phases are used in the present invention, there can be obtained improved speed of response as compared with conventional phase-separation-type functional devices using ion-conducting phases. In addition, layers or phases contained in the functional devices of the present invention are chemically bonded, so that the functional devices scarcely get out of order due to the separation of these layers phases.

BRIEF DESCRIPTION OF THE DRAWINGS

In the drawings,

FIG. 1 is a schematic view of a functional device according to the present invention.

DETAILED DESCRIPTION OF THE INVENTION

Figure 2:
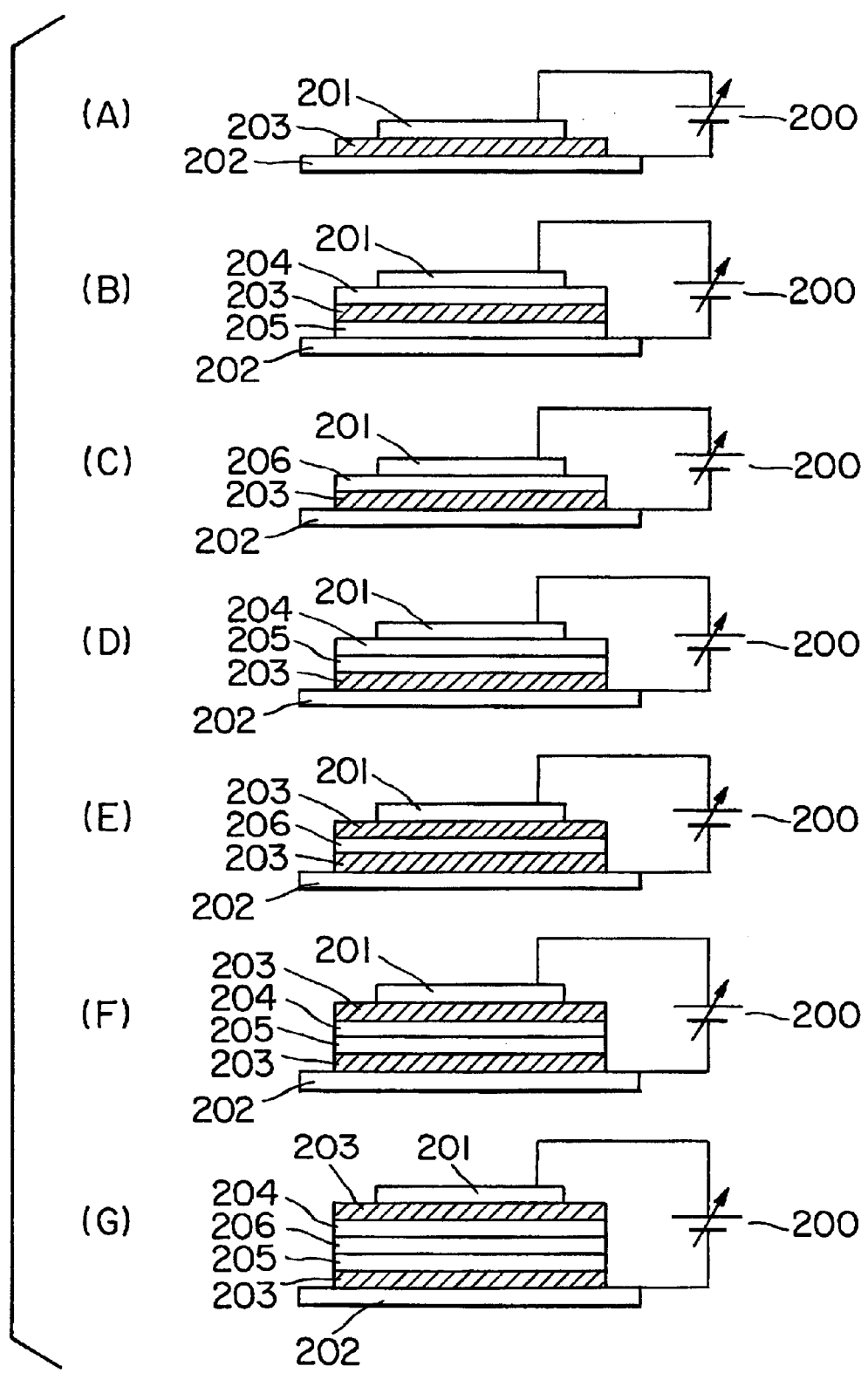
FIG. 2 is a schematic view showing light-emitting devices comprising functional devices of the present invention.

Embodiments of the present invention will be described in detail hereinafter.

For hole- or electron-conducting organic polymer chains that can be used as the chain A or B in the present invention, there are used conventional electrically inactive polymer chains, such as polyethylene, polysiloxane, polyether, polyester, polyamide and polyimide chains, containing in their main chains or as pendant side chains those substituents having photo electric-charge-generating property or hole- or electron-transporting property as described below.

Examples of such substituents include phthalocyanine derivatives, naphthalocyanine derivatives, azo compound derivatives, perylene derivatives, indigo derivatives, quinacridone derivatives, polycyclic quinone derivatives (e.g., anthraquinones), cyanine derivatives, furalene derivatives, nitrogen-containing cyclic compound derivatives (e.g., indole, carbazole, oxazole, isooxazole, thiazole, imidazole, pyrazole, oxadiazole, pyrazoline, theathiazole, triazole, etc.), hydrazine derivatives, triphenylamine derivatives, triphenylmethane derivatives, stilbene derivatives, quinone compound derivatives (e.g., anthraquinone diphenoquinone, etc.), and polycyclic aromatic compound derivatives (e.g., anthracene, pyrene, phenanthrene, coronene, etc.). Further, a semiconducting or conducting ladder polymer chain may be formed by thermally treating, to form fused rings, a polymer to which a perylene tetracarboxylic acid derivative substituent has been introduced as a side chain.

The polymer chains having such side chains may be synthesized by polymerizing monomers having the above-described side chain structures. Alternatively, they may be synthesized by using polymer chains having binding functional groups such as hydroxyl or carboxyl group, and chemically binding the above-described side chain structures to these functional groups.

Conjugated polymer chains may also be used as the hole- or electron-conducting organic polymer chains. Preferred examples of useful conjugated polymer chains include aromatic conjugated polymers (e.g., polyparaphenylene, etc.), aliphatic conjugated polymers (e.g., polyacetylene, etc.), heterocyclic conjugated polymers (e.g., polypyrrole, polythiophene, etc.), hetero-atom-containing conjugated polymers (e.g., polyanilines, polyphenylene sulfide, etc.), and complex conjugated polymers in which the constitution units of the above-described conjugated polymers are alternately combined (e.g., poly(phenylene vinylene), poly (arylene vinylene), poly(ethylene vinylene), etc.). In addition, there are conveniently used oligosilanes, for instance, polysilanes, and polymers in which disilanylene-carbon conjugated polymer structures (specifically, disilanylene allylene polymers, (disilanylene)ethenylene polymers, or (disilanylene)ethynilene polymers) and carbon conjugated structures are alternately connected. These conjugated polymers of main chain type are more excellent in carrier-transporting property than the above-described polymers of pendant type, so that the former is more favorable than the latter. In particular, polysilanes and polyparaphenylenes (converted from precursors that will be described later) are preferred because their molecular weights are readily controllable by a living polymerization method or the like. Further, aromatic ladder polymers having fused rings, which can be obtained by thermally treating polyethylene derivatives having cyano group such as polyacrylonitrile, can also be favorably used. This is because the molecular weight of polyacrylonitrile is easily controllable, and the carrier-transporting property of the same is also readily controllable by adjusting the proportion of ladder.

Besides the above-described organic polymer chains, inorganic polymer chains such as phosphorus- or nitrogen-containing polymer chains may be used. Further, there are also used polymer chains in which aromatic ligands are coordinated to polymer chains such as phthalocyanate polysiloxane.

In the present invention, the above-described chains A and B may be either different molecules or a combination thereof. In the latter case, they may be combined in any manner; and examples of such combinations include block copolymers in which the chain A and the chain B are alternately combined, and graft copolymers in which one of the chains is grafted to the other.

By using a plurality of the above-described polymer chains, or a copolymer in which two or more different chains are combined, it is possible to produce a multi-component multi-phase type polymeric shaped material having a three-dimensional bicontinuous nano phase separation structure for use in a functional device of the present invention. The three-dimensional bicontinuous nano phase separation structure herein means a continuous three-dimensional network in which two or more phases are three-dimensionally inter-penetrated in a size in the order of nano meters.

The block copolymers may be in any molecular chain configuration. Examples of useful molecular chain configurations include di-block copolymers of A-B type, triblock copolymers of A-B-A type, and star-shaped molecular chain configurations. The star-shaped molecular chain configurations include a configuration in which block copolymer chains radially come out from the center, and a configuration in which different polymer chains come out from the center. Further, the block copolymers may be graft-type block copolymers. Furthermore, it is also possible to use block copolymers having 4 or more blocks, such as block copolymers of (A-B)n or (A-B-A)n type.

These block copolymers can be produced by various polymerization methods. In any of the polymerization methods, corresponding monomers are successively added to synthesize the block copolymers. Most preferably, the block copolymers are synthesized by means of living polymerization. By subjecting monomers having double bond such as vinyl compounds or butadienes, cyclic ether monomers such as ethylene oxides, or cyclic oligosiloxane monomers to living anion or cation polymerization, it is possible to synthesize block copolymers having narrow molecular weight distributions, and precisely controlled molecular weights and monomer ratios. A living radical polymerization method can also be used. When such a living polymerization method is effected, it is preferable that solvents to be used be fully dried by the use of a desiccant such as metallic sodium, and deaerated by freeze-drying or by bubbling with an inert gas or the like. The reaction may be carried out under reduced pressure. It is however preferable to carry out the reaction in a stream of an inert gas, preferably under a pressure of 2 atom or more. When the reaction is carried out under pressure, moisture, oxygen, and the like are effectively be prevented from entering into a reactor; and it is also possible to effect, at relatively low cost, the reaction process under the dehydrated and deaerated conditions.

It is possible to synthesize the block copolymers not only by the above-described living polymerization methods, but also by a reaction between macromers such as telechelic polymers, or by the polymerization of a macromer, which is initiated at the end of the molecule of the macromer.

The graft copolymers can also be synthesized by various techniques. For example, a graft copolymer can be synthesized by allowing the main or side chain of a polymer to grow a second polymer main chain, or by copolymerizing a low-molecular-weight monomer with a macromer having a polymerizable group at its end.

When it is tried to form a phase separation structure by the use of any of the above block or graft copolymers, a phase separation structure having unit cells of few nanometers to several tens nanometers are often formed in a self-developing manner. Moreover, it is possible to impart extremely high regularity to such a fine structure unlike in the case of a phase separation structure obtained from a simple mixture. In the present invention, the polymeric shaped material has a separation structure having extremely high regularity, similar to crystalline structure, often referred to as "ordered-bicontinuous double-diamond structure (hereinafter abbreviated as OBDD)". The OBDD structure herein means a double-diamond network that is also referred to as tetrapod network. When a three-dimensional network phase separation structure such as an OBDD structure is formed, it is preferable that the mean diameter of openings in the three-dimensional network of each phase be 100 nm or less, preferably 50 nm or less, and more preferably 20 nm or less. In general, it is convenient to form the network so that the mean diameter of openings will be approximately 10 to 100 nm. The mean diameter of openings can be measured by the X-ray scattering or X-ray small angle scattering method.

By forming such a fine phase separation structure, it is possible to obtain an interfacial area of few square meters per gram, and even an extremely large interfacial area of about 1000 m$^2$/g in some cases. For the functional device of the present invention, a phase separation structure with an interfacial area of 10 m$^2$/g or more is usually used. It is relatively difficult to obtain such a large interfacial area by the phase separation of a simple blend system; however, it can readily be attained by the use of a block or graft copolymer. The mean diameter of openings in the three-dimensional network of each phase varies depending upon the molecular weight of the block or graft copolymer used, and the combination of polymer chains. By increasing the molecular weight, it is possible to increase the mean diameter. On the contrary, by decreasing the molecular weight, it is possible to decrease the mean diameter. Further, in the present invention, it is possible to adopt not only an OBDD structure but also any of various structures such as Gyroid structures(G-surface structures), T-surface structures, P-surface structures, and D-surface structures; functional devices having different structures show different functions. The Gyroid, T-surface, P-surface, or OBDD structures herein is a double-network-type micro phase separation structure having a base surface that is an infinite periodic minimal surface represented by the following approximate expression in the three-dimensional XYZ coordinates space, and two independent parallel curved surfaces that are respectively present at a certain distance from the base surface, the curved surfaces forming interfaces.

Gyroid structure(G-Surface structure):
$\sin x \cos y + \sin y \cos z + \sin z \cos x = 0$ T-Surface structure:
$\cos x \cos z - \sin y \sin z = 0$ P-Surface structure:
$\cos x + \cos y + \cos z = 0$ OBDD structure:
$\cos x \cos y \cos z + \cos x \sin y \sin z + \sin x \cos y \sin z + \sin x \sin y \cos z = 0$ Besides the above-described double networks, a lamella-cathenoid structure, a disordered structure, or the like may be formed. The lamellacathenoid structure means a phase separation structure having a lamellar structure in which one layer (layer A) is sandwiched between other layers (layers B), characterized in that the layers B are connected to each other by a plurality of columns that penetrate the layer A. The disordered structure is a phase separation structure consisting of two or more phases, characterized in that one of the phases is branched to form a three-dimensional network cylinder phase.

It is possible to form these various structures by changing the monomer ratio in the block or graft copolymer, or the compatibility between the blocks in the copolymer. Further, these structures formed have extremely high regularity and homogeneity, so that they have such a characteristic feature that they have few defects, and, as a result, have good properties as compared with phase separation structures obtained from simple blends of polymers. In addition, the phase separation structure of the device of the present invention is a three-dimensional network in which continuous phases interpenetrate into each other. Therefore, even when compared with other phase separation structures such as O-in-W- or W-in-O-like structures, cylinder structures and lamellar structures, the three-dimensional bicontinuous phase separation structure of the device of the present invention is excellent in carrier-transporting property, and has a large interfacial area.

Of the aforementioned various three-dimensional bicontinuous structures, OBDD structures and Gyroid structures are preferred because they structurally have few traps, and thus show excellent carrier-transporting property; and OBDD structures are most preferred. To form Gyroid or OBDD structures, it is preferable to use di-block copolymers of A-B type, or tri-block copolymers of A-B-A or B-A-B type.

To make a polymeric shaped material having a three-dimensional bicontinuous phase separation structure, the volume fractions of two phases (respectively referred to as phase A and phase B) that constitute the bicontinuous structure are important. It is favorable to make the volume fraction of one of the two phases from 20 to 80%, preferably from 45 to 75%, more preferably from 55 to 75%, and most preferably from 60 to 70% of the whole polymeric shaped material. In particular, in the case of the above-described double network such as an OBDD or Gyroid structure, it is favorable to make the volume fraction of the phase constituting the double network from 62 to 67%. To adjust the volume fraction, either the monomer ratio in a block or graft copolymer, or the molecular volume of a polymer chain can be controlled. There are many possible methods for controlling the molecular volume of a polymer chain. For example, when polyvinyl pyridine chain is made into a quaternary salt by the use of an alkyl group, the molecular volume of the alkyl group or counter anion may be changed; and, when polyaniline chain is doped with an acid, the molecular volume of the acid may be changed.

Further, the volume fraction of a phase may be adjusted by adding, to a predetermined phase, a material that has high affinity for the phase, thereby swelling the phase. In this case, the material to be added to the phase is preferably a homopolymer of the polymer chain that constitutes this phase.

In the case of the phase separation structure using such a copolymer, the polymer chains are aggregated in such a state that they penetrate the interface between the phases A and B. As a result, the phases A and B are perfectly jointed by chemical bond, so that they do not separate at the interface between them unless the polymer chains are broken. The chemical bond is, in general, one that connects the blocks in the above-described copolymer, and at least one bond selected from the group consisting of covalent bond, ionic bond, hydrogen bond and coordinate bond. It is most preferable from the viewpoint of bond strength that the chemical bond be covalent bond. Further, among various types of covalent bond, carbon-carbon linkage, carbon-silicon linkage, carbon-oxygen linkage such as ether linkage, carbon-nitrogen linkage such as amide linkage and imide linkage, carbon-sulfur linkage such as thioether linkage, and silicon-oxygen linkage such as siloxane linkage are desirable.

Without the use of any copolymer, it is possible to form a phase separation structure in which two adjacent phases are chemically bonded at the interface between them by using a polymer having a crosslinking reactive group that has been introduced to the side chain or terminal end of the polymer. This means that, when a phase separation structure is formed by the use of a mixture of two different polymeric materials that form phases A and B, the phases A and B can be chemically bonded at the interface between them by crosslinking the reactive groups.

To form a good three-dimensional bicontinuous nano phase separation structure, it is necessary that the polymer chain A and the polymer chain B, the polymer chain A and the precursor of the polymer chain B, the precursor of the polymer chain A and the polymer chain B, or the precursor of the polymer chain A and that of the polymer chain B be incompatible with each other. In the case where a precursor is used, it is converted, after the formation of a phase separation structure, to a desired polymer chain by a chemical reaction that is carried out, in most cases, at a temperature below the glass transition temperature of the copolymer to be produced. To form a good phase separation structure, it is preferable that blocks in the polymer chains that are incompatible with each other have weight-average molecular weights of 10,000 or more, more preferably 20,000 or more.

To form, in particular, a structure having extremely high regularity such as an OBDD structure, an OTDD structure (ordered-tricontinuous double-diamond structure) or a Gyroid structure, it is favorable that the molecular weight distribution of the block copolymer to be used be narrow and that the ratio of weight-average molecular weight Mw/number-average molecular weight Mn be preferably 1.15 or less, more preferably 1.10 or less.

The formation of the bicontinuous phase separation structure of the present invention is conducted by the use of the above-described block or graft copolymer composed of two or more polymer chains that are incompatible with each other. Such a polymeric material is dissolved in a proper solvent to obtain a coating liquid. This coating liquid is applied to a proper substrate by such a method as a spin coating, dip coating or casting method, dried, and then optionally subjected to thermal treatment. A multi-component multi-phase type polymeric shaped material film for use in the functional device of the present invention can thus be produced. By conducting the thermal treatment at a temperature higher than the glass transition temperatures of both of the polymer chains that constitute the block or graft copolymer, it is possible to form a good phase separation structure. In particular, when a coating method such as a spin coating method in which a solvent is quickly evaporated to dryness is employed, it is preferable to conduct the thermal treatment in order to obtain a good phase separation structure. It is preferable that the thermal treatment be conducted in an inert gas atmosphere or under vacuum in order to avoid oxidation or the like.

It is possible to form a phase separation structure not only by the coating of a solution, but also by a method in which the block or graft copolymer is melted, and the melt is applied to a proper substrate, shaped, and then cooled. Further, a polymeric material in molten state may be made into a desired shape by hot pressing, injection molding, transfer molding, or the like. A better phase separation structure can be obtained by keeping the polymeric material preferably at a temperature above its glass transition temperature after it has been made into a film or molded.

In this film-forming process using a coating method, by adding to a coating liquid containing the copolymer beforehand, an additive such as a dopant that shows high affinity specifically for one of the two polymer chains that will cause phase separation, it is possible to easily localize the dopant only in the phase for which the dopant shows high affinity when a phase separation structure is formed. For example, in the production of an EL device having a bicontinuous phase separation structure composed of a hole-transporting phase and a light-emitting phase, or a bicontinuous phase separation structure composed of three phases of a hole-transporting phase, a light-emitting phase and a electron-transporting phase as will be described later, if a luminescent colorant that has high affinity for the light-emitting phase is added to a coating liquid in a small amount, the light-emitting phase is selectively doped with the luminescent colorant. The luminous efficiency can thus be improved. Similarly, ultrafine particles of few nanometers to several tens nanometers whose surfaces have been treated so that they will show high affinity specifically for one of the phases can also be localized only in this phase by coating operation only. Examples of such ultrafine particles include ultrafine particles of metals such as gold, silver, copper, white gold and paradium, those of semiconductors such as CdS, CdSe, CuBr and silicon, and those of metallic oxides such as $TiO_2$. These fine particles are usually used after being subjected to surface treatment with surface-active agents or the like.

The dopant may be chemically bonded to the side or main chain of the block or graft copolymer without mixing it with the copolymer. In this case, it is possible to easily localize the dopant in a specific phase by introducing such a functional molecular structure only to the polymer chain that constitutes the specific phase.

Further, by introducing, into the main or side chain of the polymer chain, a structure that is easily combined with a specific dopant, and then exposing the polymer chain to dopant vapor or a dopant solution before or after the formation of a phase separation structure, it is possible to introduce the dopant to the polymer chain. For instance, if a structure having double bond such as isoprene or butadiene unit is introduced into the main chain of the polymer chain, it is possible to dope the polymer chain with osmium by allowing the polymer chain to react with osmium oxide or the like. Further, if a chelating structure is introduced into the main chain of the polymer chain, the polymer chain can be doped with a metallic ion or the like. Even when a chelating structure has been introduced into the main chain, it can also be introduced as a substituent, for example, into the ester site of polyacrylic ester. Furthermore, if an ion exchange resin structure having an ionic group such as pyridinium salt structure is introduced, the doping of a metallic ion or the like can be attained by means of counter ion exchange.

The phase separation structure of the present invention can be formed by various methods other than the above-described method using a block or graft copolymer as a starting material.

For example, a phase separation structure composed of two phases may be formed in such a manner that, after mixing a polymeric monomer that will form one of the two phases and a polymeric monomer that will form the other phase, the monomers mixed are polymerized by the application of heat or light or by the addition of a catalyst. In this case, when an end or side chain group that can react with one of the two polymeric monomers to form linkage is introduced into the other polymeric monomer, a block or graft copolymer containing polymeric components of the two phases is formed. As a result, there can be formed a phase separation structure in which the two phases are bonded to each other at the interface between them as in the case where a block or graft copolymer is used as a starting material.

Further, it is also possible to obtain a phase separation structure by the following reactive processing method: two telechelic polymers that are incompatible with each other, into which end groups capable of being combined with each other have respectively been introduced are mixed, and the end groups are then combined to form a block copolymer in the mixed system.

Furthermore, a phase separation structure of the present invention in which two phases are bonded at the interface between them can also be formed in the manner as described below. A phase separation structure is firstly formed by the use of a block or graft copolymer consisting of a polymer chain having double bond in its main chain, such as polyisoprene or polybutadiene chain, and a desired polymer chain. Thereafter, the polymer chain having double bond in its main chain is removed by such a method as ozone treatment. Into the inner surfaces of voids in the porous body produced, a polymerization initiator is chemically introduced. This porous body is immersed in a monomer solution or the like to cause polymerization reaction, thereby filling the voids with a polymer to form a desired phase separation structure. In this case, an electrolytic polymerization reaction may be utilized.

The polymeric components of the phases that constitute the phase separation structure of the functional device of the present invention are not necessarily incompatible with each other. This is because, as long as the precursor polymeric compounds of these polymeric components, for example, are incompatible with each other, the phase separation structure can be formed by the use of these precursor polymers. After forming a phase separation structure by using the precursor polymeric compounds, the resultant can be converted into a final polymeric material by the application of heat or light, or by the addition of a catalyst. In this case, by properly selecting the reaction conditions, the reaction for conversion can be carried out without breaking the phase separation structure that has been formed by the use of the precursor polymers. It is desirable that the reaction for conversion be carried out at a temperature below the glass transition temperatures of the precursor polymers so that the phase separation structure once formed will not be broken. It is therefore preferable to use, as needed, a catalyst that promotes the reaction for conversion.

For example, polyparaphenylenes can be synthesized from precursor polymers that are obtained by polymerizing cyclodiene monomers represented by the general formula (I):

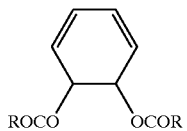

(I)

wherein R represents a substituted or nonsubstituted alkyl, aryl or aralkyl group. These polyparaphenylene monomers (hereinafter referred to as PPP monomers) can readily be block-copolymerized with other olefin monomers (e.g., acrylic esters, methacrylic esters, styrene, vinyl alcohol, etc.) by radical polymerization or the like. Further, also acceptable is a block or graft copolymer of PPP monomers whose substituents (R in formula (I)) at the ester group are different from each other and which are incompatible with each other.

Further, a conducting ladder polymer of pyridine type can also be formed by thermally treating polyacrylonitrile chain at a temperature of 200° C. or higher, preferably 400° C. or higher.

To stabilize the phase separation structure, the polymeric material can be three-dimensionally crosslinked, after the formation of the phase separation structure, by adding a crosslinking agent or introducing a crosslinking group to the polymeric material. By forming such cross-linkage, it is possible to further improve the thermal or mechanical strength, etc., of the functional device of the present invention. A functional device good in durability can thus be produced. Also when the reaction for conversion of the precursor polymers as mentioned above is carried out, it is preferable to conduct crosslinking. If crosslinking is conducted, it becomes possible, in some cases, to carry out the reaction for conversion even at a temperature above the glass transition temperatures of the precursor polymers.

When the durability of the device, such as heat resistance, is taken into consideration, it is preferable that the phases be incompatible with each other. However, even a phase separation structure composed of phases that are not incompatible shows improved durability when such a method that polymer chains constituting the respective phases are crosslinked is adopted.

The bicontinuous phase separation structure as mentioned above is such that the phase A and the phase B respectively form three-dimensional networks and that these two three-dimensional networks are entangled with each other. The schematic view of the functional device of the present invention, having such a structure is shown in FIG. 1. In FIG. 1, the three-dimensional network of phase A 101 and that of phase B 102 are entangled with each other. It is also possible that the phase A is connected only to electrode 103 and that the phase B is connected only to electrode 104.

Each phase is herein continuous. It can therefore be considered that all of the phase separation domains in each phase contained in the shaped material are connected. Further, since the phases A and B are entangled to constitute a complicated three-dimensional network, the area of the interface between these two phases is extremely large. Namely, the structure of the functional device of the invention in which electrode terminals are respectively connected to the phases A and B is, in brief, considered to be the same as the structure of a conventional layered device in which phases A and B are laminated to each other. However, as compared with such a layered device, the structure of the functional device of the present invention can have an extremely large area of the interface between the phases A and B (interfacial area per unit volume of each phase). Therefore, carriers (electrons, holes, or ions) are smoothly exchanged between the phase A and the phase B, so that increased output power and high speed of response can be obtained as compared with conventional functional devices of film-laminated type.

Moreover, in the functional device of the present invention, it is possible to drastically improve, as mentioned above, the durability in terms of the separation of the phases A and B at the interface between them. The performance of the above-described conventional layered devices often undergo deterioration due to the separation of the phases A and B caused at the interface between them, or due to denaturation caused when a strong electrical field is applied. It has thus been difficult to improve the durability of the conventional devices. On the other hand, the functional device of the present invention comprises a block or graft copolymer having, as polymer chains, the components of the phases A and B, and the polymer chains penetrate the interface between the phase A and the phase B. This means that the phase A and the phase B are perfectly bonded to each other at the interface between them by chemical bonding that inherently forms the polymer chains. For this reason, the functional device of the invention seldom suffers the above-described separation or degradation, and thus shows good durability. Moreover, carriers are smoothly transferred. It is impossible to attain these advantageous features by the conventional devices having phase separation structures obtained from simple blends of polymers.

The improvement in durability and functions that can be attained when two phases are bonded at the interface between them as mentioned above is obtained more satisfactorily when the number of polymer chains that form chemical bond at the interface is greater. Even when a phase-separated body in which two phases are bonded at the interface between them is washed with solvents, each solvent capable of dissolving therein only a homopolymer of the polymer chain that constitutes a specific phase, the polymer chains are not eluted. This tendency is remarkable in phase-separated bodies made from block or graft copolymers, in particular, those copolymers having molecular weight distributions Mw/Mn as narrow as 1.1 or less. Therefore, the degree of bonding of two phases at the interface between them is higher in the following case: when a phase-separated body is washed with a sufficient amount of a solvent that can well dissolve a material (a homopolymer having a molecular weight nearly equal (within ±50% of the weight-average molecular weight) to that of a specific block chain in the case where the phase-separated body is made from a block copolymer, or that of a grafted chain in the case where a phase-separated body is made from a graft copolymer) that constitutes a specific phase (hereinafter referred to as phase to be extracted), the remaining rate of the phase to be extracted after washing is higher. The remaining rate is generally 20% by weight or more, preferably 50% by weight or more, more preferably 90% by weight or more of the phase to be extracted. For the washing, there is used a solvent whose solubility for the material constituting the phase to be extracted is 5 times or more the solubility for a material constituting the other phase. The washing is conducted in the following manner: the phase-separated body is made into a film preferably having a thickness of 1 μm or less, and immersed in a solvent preferably with stirring. This washing is continued until the solvent is saturated with the phase to be extracted.

In the phase separation structure made from the block or graft copolymer consisting of the polymer chains A and B, the interface between the phases A and B is such that points of connection of the polymer chains A and B lie in a single plane. Namely, if any of various functional molecules is introduced to these points of connection, it is possible to form phase C, third continuous phase, composed of a thin layer made of the functional molecule. For instance, if a photo electric-charge-generating molecule is used as the functional molecule, and an electron-transporting polymer chain and a hole-transporting polymer chain are used as the polymer chains, it is possible to form a photoelectric conversion device that shows extremely high efficiency. Further, when an unconjugated insulating molecule is used instead of the functional molecule, and conjugated polymer chains are used as the two polymer chains, semiconducting or conducting phases separated by an extremely thin insulating layer are formed. The phase C may be an aggregate of polymer chains. By using a tri-block copolymer composed of chain A-chain C-chain B, it is possible to form a structure in which continuous phase C is present at the interface between phases A and B that constitute a bicontinuous structure. In this case, there can be formed an OTDD structure in which the phase A and the phase B have different diamond skeletons, and the space connecting these phases is equivalent to the phase C. When such an OTDD structure is formed, it is desirable to make the volume fraction of the phase C from 40 to 70%, preferably from 45 to 55%. In this case, the ratio of (the volume fraction of the phase A)/(the volume fraction of the phase B) is preferably from 0.7 to 1.3, more preferably from 0.9 to 1.1, and most preferably 1.

In the case where the phase separation of such a tri-block copolymer is used, it is possible to form a good phase separation structure if any combination of a hydrophilic polymer, a hydrophobic polymer and a fluorine-containing polymer is used for the chains A, B and C.

In this case, it is possible to form a silicon oxide film at the interface between the phase A and the phase B by the use of a tri-block copolymer in which an oligo- or poly-siloxane, for example, an oligoalkoxy- or polyalkoxy-siloxane, such as poly(di-t-butoxysiloxane) or poly(di-i-propoxysiloxane) is used as the polymer chain C at the points at which the conjugated polymer chains A and B are connected. The reason for this is as follows: when an aggregate of oligo(di-t-butoxysiloxane) chains in sheet form is heated preferably in the presence of an acid catalyst, the t-butoxy group is eliminated, and the dehydration condensation reaction of the silanol group produced occurs to form a silicon oxide film. It is possible to make the film to be formed at the interface considerably thin, and, in addition, it is theoretically rare that the film has defects. Such a film is thus very useful, for example, for the fabrication of capacitors or organic FET devices.

A silicon oxide film may also be obtained by using polysilane instead of polysiloxane, and causing oxidation by the application of light or heat after the formation of a phase separation structure. Poly(methylphenylsilylene) or poly(phenylsilylene), for example, is favorably used.

Further, it is also possible to form a silicon oxide film by using a polymer chain containing in its main or side chain a siloxane cluster such as POSS (polyhedral oligomeric silsesquioxane: polysiloxane $T_8$ cube). For example, a polymer obtained by polymerizing methacrylate $T_8$ cube ($T_8$ POSS methacrylate) represented by the following general formula (II) is preferred:

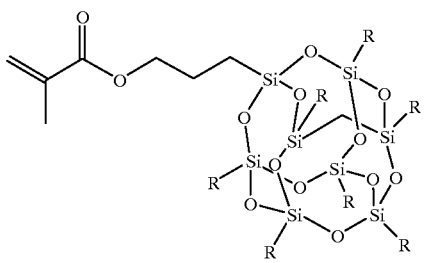

(II)

wherein R represents H, or a substituted or nonsubstituted alkyl, aryl or aralkyl group, specifically methyl, ethyl, butyl, isopropyl, cyclopentyl, cyclohexyl or phenyl group, or the like.

It is acceptable that a plurality of phases C be present in the phase-separated body. For example, C that is present between the polymer chains A and B may be two or more functional molecular chains, or a block copolymer chain consisting of two or more different blocks. For instance, in the case where C is a di-block copolymer chain, a phase-separated body may be formed by the use of a tetra-block copolymer. As will be described later, such a phase-separated body can conveniently be used for light-emitting devices, photoelectric conversion devices, transistors, capacitors, etc., and can impart improved properties to these devices due to its increased interfacial area. Moreover, this phase-separated body can simplify the production process because its structure that is comparable to complicated layered structures can be obtained, for example, by simply applying a polymer.

Furthermore, when a polymer having gas permeability such as polysiloxane is used for forming the phase C, or a material-permeable phase made from a hygroscopic polymer such as polyethylene oxide is used as the phase C, the resulting device can be used for gas sensors, pH sensors, etc.

It is possible to form a phase separation structure composed of three continuous phases even by using a graft copolymer. In this case, the graft copolymer is a di-block copolymer in which, when chain A is its main chain, chains B and C are branched chains, and the chain B is connected to the chain A through the chain C.

By utilizing the difference in affinity between the phases A and B, it is possible to bring an electrode terminal into contact only with either the phase A or the phase B. Namely, when the surface of an electrode terminal has high affinity for the phase A and low affinity for the phase B, it is possible to bring the electrode terminal into contact only with the phase A by simply applying, to the electrode terminal, a mixture of a polymer that constitutes the phase A and a polymer that constitutes the phase B. or a block copolymer, or by melting this mixture or block copolymer on the electrode terminal. This is because, in the course of phase separation, the phase A is selectively aggregated at the contact surface with the surface of the electrode terminal. On the other hand, when the surface of one of electrode terminals has high affinity for the phase A, and that of the other one has high affinity for the phase B, the electrode terminals can selectively be connected to the respective phases. For example, in the case of a device in which a phase-separated film is sandwiched between parallel-plate electrodes, it is possible to effect the above-described selective connection of electrodes in the following manner: a phase-separated film or a composition film before being phase-separated is placed between two electrodes; these three layers are brought into close contact; and the resultant is then maintained at a temperature above the glass transition temperatures of the phases that constitute the film. The simplest manner to impart affinity for a specific phase to the surface of an electrode terminal is to form, on this surface, a film of the same polymer component as that of this phase. Also in the case where a phase separation structure is formed by the use of a block copolymer, it is enough to form a film of a homopolymer of a polymer chain that constitutes one of the blocks. This technique is particularly effective in selectively connecting electrodes to the respective phases of a phase-separated body composed of three or more phases, having an OTDD phase separation structure or the like. In the case of a phase separation structure composed of two phases, phases A and B, if the surface of each electrode is coated with the same material as that of the phase A or B, it is possible to selectively connect the electrode to the phase A or B without difficulty by bringing the electrode into close contact with the phase-separated body.

Thus, by imparting high affinity for one of the phases to the surface of an electrode, it is possible to selectively connect the electrode to the phase without difficulty. However, the area in the vicinity of the interface between the phase-separated body and the electrode may be changed, when affected by the electrode surface having high affinity, from the bicontinuous structure to a lamellar phase in which a lamellar structure is formed in parallel with the surface of the electrode. It is therefore preferable to form a bicontinuous phase separation structure before an electrode is brought into contact, and to cause phase separation again by bringing the electrode into contact, and selectively annealing only the area in the vicinity of the surface of the electrode. In this case, the area that is subjected to phase re-separation is preferably in a size equal to or smaller than the mean diameter of openings in the network of the bicontinuous structure, more preferably ½ or less of the mean diameter of the openings. Further, a connecting layer may be interposed between the phase-separated body having a bicontinuous structure and the surface of the electrode. It is preferable to form the connecting layer by using any of the following materials: (i) the same copolymer as the block or graft copolymer that constitutes the bicontinuous structure, or a mixture of homopolymers containing, as monomers, the repeating units of the respective polymer chains; (ii) a polymer having high affinity for the phases that constitute the bicontinuous structure, and (iii) a mixture of amorphous organic compounds. In the case where such a connecting layer is interposed, phase separation is caused by thermal treatment after the connecting layer has been brought into contact with the phase-separated body. At this time, it is preferable to conduct the thermal treatment at a temperature below the temperature required to cause phase separation in the bicontinuous phase-separated body. Further, it is preferable to fix the phase separation structure of the bicontinuous phase-separated body by means of crosslinking or the like.

For the selective connection to an electrode, there can be employed not only the above-described method utilizing the difference, between the phases, in affinity for the surface of the electrode as mentioned above, but also a method in which an electrode is deposited only on the exposed surface of a hydrophilic phase by, for example, electroless plating.

To remove those factors that lower the performance of a device, for example, short circuit, the selective connection to an electrode is conducted so that the area of the part at which one of the phases is in contact with the electrode will be preferably 80% or more, more preferably 95% or more, and most preferably 98% or more of the contact area of the phase-separated body with the electrode. The degree of selective connection can be made clear by observation using a transmission-type electron microscope.

In general, a device is cut vertically to the interface between a phase-separated body and an electrode, and this cross-section obtained is observed by a transmission-type electron microscope. The proportion of the contact length of one of the phases at the interface shown in the cross-section to the entire length of the interface is preferably 90% or more, more preferably 95% or more, and most preferably 98% or more. In this case, the average value of contact lengths observed in two cross-sections that intersect with each other at right angle is used. For this evaluation, it is enough to observe the length of the interface to the level of 1 μm.

Without conducting the above-described selective connection, it is of course possible to attain the state equivalent, in terms of electrons, to that obtained when the selective connection is conducted, by taking the work function of the electrode and the electron affinity of the phases into consideration. Namely, an electrode is connected to one of the phases so that Schottky connection will be attained, and another electrode is connected to the other phase so that ohmic connection will be attained. However, even in this case, it is preferable to conduct the selective connection, too.

As mentioned above, the three-dimensional bicontinuous nano phase separation structure made from the block or graft copolymer is extremely fine, but has high regularity. This structure is therefore suitable for a variety of functional devices. By using such a structure as a mold, it is possible to produce a phase-separated body in which any of other polymers or materials other than polymers constitutes a bicontinuous structure, preferably an OBDD or Gyroid structure; and by connecting electrodes to this phase-separated body, it is possible to form the functional device of the present invention.

In this case, a removable phase may be used as at least one of the phases in the bicontinuous structure. This phase is selectively removed after causing phase separation to form voids, which can then be filled with any of other polymers or functional materials other than polymers. At this time, by using a phase-separated body composed of a functional polymer phase and a removable polymer phase, and removing the removable polymer phase, a porous body having a bicontinuous structure composed of the functional polymer may be formed. The voids thus produced can be filled with any other functional material to directly form a functional device. Alternatively, a porous body having a bicontinuous structure may firstly be formed, and, by the use of this porous body as a mold, functional materials are successively molded to constitute a bicontinuous structure. For instance, a first phase is firstly removed to make a porous body having a bicontinuous structure, and the voids produced are filled with a first functional material. Thereafter, a second phase is selectively removed to obtain a porous body of the first material. The voids thus formed are then filled with a second functional material to form a phase-separated body for use in the functional device of the present invention.

It is possible to obtain such a porous body having a bicontinuous structure by selectively removing one of the two phases by means of solvent extraction, or gas-phase etching such as reactive plasma etching.

A polymer chain having double bond in its main chain, for example, polyisoprene or polybutadiene, easily causes main-chain-breaking reaction when subjected to an ozone degradation method or the like. Therefore, a phase composed of such a polymer chain can readily be removed by solvent extraction or the like. The voids thus produced can then be filled with any of metals, metallic oxides, conducting polymers, etc. by such a technique as electroforming or electroless plating.

The polymer whose main chain will be broken may be a polymer whose main chain is broken either by the reaction with a main-chain-breaking agent such as ozone as described above, or by thermal or optical reaction. For example, polyethylene oxide chain is readily decomposable by heat. There may also be used poly(phenylisopropenyl ketone) that causes Norrish Type I reaction when light is applied, thereby causing main-chain-breaking reaction. Polysilane chain is also preferred because it tends to cause main-chain-breaking reaction when light is applied.

Catalysts such as photo acid-generating agents, or photosensitizers that can promote these main-chain-breaking reactions may also be added. In this case, by selecting an additive having high affinity for a phase to be decomposed, it is possible to dope the phase to be decomposed with this additive. By doing so, not only the decomposition reaction is effectively promoted, but also adverse effects to the other phase, such as side reactions, are prevented.

A process for producing a porous body having a bicontinuous structure by the application of light or the like is characterized by comprising the following steps of:

(1) applying light or the like to a phase-separated body having a bicontinuous phase separation structure composed of a block or graft copolymer, in which at least one phase is an aggregate of polymer chains that will cause a main-chain-breaking reaction when light or the like is applied (hereinafter referred to as decomposable phase), and (2) removing the decomposable phase by means of wet or dry etching. It is preferable to effect this process by a roll-to-roll continuous process after making the phase-separated body having a bicontinuous phase separation structure into a sheet. Visible light, ultraviolet light, or the like may be used as the light to be applied in this process.

To remove a specific phase, it is not always necessary to break the main chain of the polymer that constitutes the phase. A polymer that constitutes a desired phase can be removed by means of solvent extraction or the like, if the connection between blocks in a block copolymer that constitutes a phase separation structure, or the connection between the main chain and the side chain of a graft copolymer that constitutes the same is broken. In this case, after forming a bicontinuous structure by the use of a tri-block copolymer of A-C-B type, or a graft copolymer in which a di-block copolymer chain of B-C type is connected to the main chain, chain A, through the chain C, a reaction is caused to break the main chain of the chain C. Thereafter, the phase B can be removed by extraction with a solvent in which the polymer A is insoluble or sparingly soluble and which dissolves decomposition products of the chain C, and the chain B. It is preferable to use, as the chain C, polydienes having double bond in their main chains, polysilanes, etc. as mentioned above.

Instead of the chain C, a low-molecular-weight chemical linkage may be used. It is preferable to use, as the chemical linkage, one that is cleaved by heat, light, or catalysts such as acids. Double bond or ester linkage, for instance, is conveniently used.

In the aforementioned process, any solvent selected from various ones can be used for the solvent extraction, and it is proper to use a solvent that can fully dissolve a phase to be removed. Isoamyl acetate, benzyl propionate, esters such as ethyl butyrate, and terpenes such as α-pinene, β-pinene, γ-terpinene, δ-3-carene, limonene and terpilene do not have high toxicity. Moreover, by using any of these solvents, the waste liquor disposal step can be eliminated. d-Limonene is particularly preferred when safeness to the human body and environment is taken into consideration. These solvents are also useful as the mediums of coating liquids containing copolymers.

Further, in a bicontinuous structure composed of three continuous phases, such as an OTDD structure made from a tri-block copolymer of A-C-B type, or an OTDD structure in which phase C is formed at the interface between phases A and B, made from a graft copolymer in which a di-block copolymer chain of B-C type is connected to a main chain, chain A, through the chain C, those voids produced when the phases A and B are removed may be filled with any of conducting materials such as metals and metallic oxides, and semiconducting materials. For example, by using, as the phase C, a three-dimensionally crosslinking insulating phase, such as a polysilicone phase, especially a polydialkoxy siloxane phase, and filling the voids formed by the removal of the phases A and B with a metal such as gold or copper by such a technique as electroforming or electroless plating, it is possible to obtain a capacitor having high capacity. In this case, it is of course necessary to cause phase separation beforehand so that an anode is connected only to the phase A and that a cathode is connected only to the phase B by, for example, covering the cathode and the anode with films having high affinity for the phase A and the phase B, respectively.

After filling the voids with a metal or metallic oxide by means of electroforming or the like, the polymer phase is removed by conducting wet etching such as washing with a solvent, or vapor-phase etching such as reactive plasma etching to form a porous body having a bicontinuous structure composed of a three-dimensional network of the metal or metallic oxide. Thereafter, this porous body may be impregnated with a desired hole- or electron-conducting material. When a star-burst-type organic amorphous small molecule is used as the hole- or electron-conducting material, the porous body can be impregnated in this organic molecule that has been melted in advance. In the case where an organic polymer is used, the porous body may be immersed in a solution of this polymer. Further, in the case where a metallic oxide semiconductor or compound semiconductor is used, the porous body may be immersed in a sol of such a material.

There is no particular limitation on the shape of the electrode terminal; and an electrode terminal in the shape of a plate, a film, a porous film, a bar, a fiber, a mesh, a dot or a tube may be used. Moreover, inorganic or organic conductors or semiconductors can be used to make the electrode; and patterned electrodes such as a comb-shaped electrode can also be used. In addition, it is also possible to use a three-dimensional network porous body having the above-described bicontinuous structure.

The structure of the functional device according to the first or second embodiment of the present invention can be used, for example, for photoelectric conversion devices, solar batteries, light-emitting devices, organic FET devices, capacitors, electrochromic devices, and polymeric secondary batteries. Those device structures and phase separation structures that are suitable for these applications will be described in detail hereinafter. In the following description, examples are given in terms of block copolymers. However, as mentioned hereinbefore, graft copolymers can, of course, be used instead of the block copolymers.

Photoelectric Conversion Device and Solar Battery

In a photoelectric conversion device or solar battery, a phase-separated body sandwiched between parallel-plate electrodes is generally disposed. A comb-shaped electrode on which a phase-separated film is formed can also be used. Any material can be used for the electrodes. However, in the case of parallel-plate electrodes, at least on of the electrodes is preferably an ITO electrode, or a transparent electrode made from, for example, tin oxide doped with fluorine. Further, it is preferable that the phase A or B be in contact with only one of the two electrodes. It is therefore preferable that a thin film of the polymer component of the phase A or B be formed between the surface of each electrode and the phase-separated body. This thin film is usually formed by the application of a homopolymer of polymer chain A or B. The thickness of the thin film is preferably smaller than the mean diameter of openings in the phase-separated body, which will be described later in detail. The phase A is composed of p-type semiconducting or hole-transporting polymer chain A; and the phase B is composed of n-type semiconducting or electron-transporting polymer chain B. Specifically, for the phase A, polyacrylic or polymethacrylic esters having as side chains polyvinyl carbazoles, triallylamines, oligothiophenes or oligopyrroles, polyparaphenylene vinylenes, polyparaphenylenes, and polyacetylenes are used, and for the phase B, photo polymer chains containing, in their main chains or as side chains, nitrogen-containing heterocyclic compounds such as perylenes, furalenes, oxadiazoles or triasoles are used. Further, there can also be used, for the phase A or B, a conjugated polymer chain that is p- or n-doped polyacetylene, or a combination of a p-doped polypyrrole derivative and an n-doped polythiophene derivative. Furthermore, when a photosensitizing colorant molecular structure whose HOMO (highest occupied molecular orbital) is lower than that of the hole-transporting polymer chain A and whose LUMO (lowest unoccupied molecular orbital) is higher than that of the electron-transporting polymer chain B is introduced as the phase C, the efficiency is further improved. In addition, by using conjugated polymer chains having conductivity as the chains A and B, and by using, as the phase C, an aggregate of molecules, each consisting of two blocks, C1 and C2, that can cause photoexcited electron transfer (e.g., the phase C can be made from a tetra-block copolymer composed of chain A-chain C1-chain C2-chain B), it is possible to form a device that hardly suffers the lowering of photoelectric conversion efficiency, which tends to be caused by charge-up. In this case, when polymer chains of polythianaphthene derivatives are respectively used for the chains A and B, and when the phases A and B are doped with Br⁻or the like, these phases are nearly transparent to visible light. Therefore, when such a phase-separated body is used for solar batteries or the like, electric power is produced at high efficiency.

The type of phase separation structure is preferably a bicontinuous phase separation structure of OBDD type. Further, to prevent scattering of light, to ensure sufficient transmittance, and to attain an increased interfacial area, the mean diameter of openings in the structure is preferably 200 nm or less, more preferably 100 nm or less, and most preferably 30 nm or less. The mean diameter of the openings is ideally from 5 to 10 nm.

Similarly, a tri-block copolymer of chain A-chain C-chain B (the molecular weight of the chain C is sufficiently low as compared with those of chains A and B; the chain A and the chain B are incompatible with each other) may be used. In this case, an electron-conducting polymer chain is used as the chain A; a hole-conducting polymer chain is used as the chain B; and an ion-conducting polymer chain is used as the chain C. An electrochemical photoelectric conversion device can be obtained if a tri-continuous structure in which an electrolytic salt that can reversibly be oxidized and reduced is dissolved in the phase C is formed by casting a solution of the electrolytic salt when a phase-separated body is formed. In this case, it is preferable to make the oxidation-reduction level of the electrolytic salt as follows: in the case where the chain A is photo-excitable, this level is made higher than the LUMO of the chain A, and lower than the LUMO of the chain B; in the case where the chain B is photo-excitable, the level is made higher than the HOMO of the chain A, and lower than the HOMO of the chain B; and in the case where both of the chains A and B are photo-excitable, the level is made higher than the LUMO of the chain A, and lower than the HOMO of the chain B. Further, if necessary, the phase A and/or phase B may be doped, or the interface between the phase A or B and the phase C may selectively be doped with a photosensitizing colorant. In this case, a photosensitizing colorant structure can be introduced to the connection site between the chain A or B and the chain C.

Light-Emitting Device

Also in a light-emitting device, the phase-separated body of the present invention, sandwiched between parallel-plate electrodes is usually disposed. Typical structures of the light-emitting devices according to the present invention are shown in FIG. 2. In this figure, each light-emitting device has such a structure that a multi-component multi-phase type polymeric shaped material is sandwiched between electrodes 201 and 202; and these electrodes are connected to a variable power source 200. Between these electrodes, there can be placed a plurality of the polymeric shaped materials, or a combination of the polymeric shaped material and other layers.

In structure (A), a multi-component multi-phase type polymeric shaped material 203 serving as a phase separated into a hole-transporting phase and an electron-transporting phase is sandwiched between electrodes 201 and 202. In structure (B), a hole-transporting layer 204 and an electron-transporting layer 205 are respectively provided between each electrode and a polymeric shaped material 203. In the case of the structure (A) and the structure (B), there can be obtained improved efficiency of recombination of positive and negative carriers injected from the two electrodes.

In structure (C), a multi-component multi-phase type polymeric shaped material 203 is sandwiched between electrodes 201 and 202 together with a light-emitting phase 206. This polymeric shaped material functions as a phase separated into a light emitting phase and a conducting phase. Further, also in structure (D) to structure (G), a multi-component multi-phase type polymeric shaped material 203 functions as a phase separated into two phases equal to the adjacent phases. Furthermore, the functional device of the present invention may be composed of a plurality of the multi-component multi-phase type polymeric shaped materials like in the cases of structure (E) to structure (G).

Each one of the structure (C) to structure (G) has an increased area of the interface between the electrode and the light-emitting or charge-transporting phase, and thus shows increased efficiency of injection of carriers from the electrodes.

For the conducting polymer chain, polyanilines, polythiophenes, polypyrroles, etc. areused; and they are usually doped thoroughly. Further, a ladder polymer obtained by subjecting polyacrylonitrile to thermal treatment can also be used.

There may be used a bicontinuous structure composed of three or four continuous phases that can be obtained by the use of a tri- or tetra-block copolymer as described in the item of Photoelectric Conversion Device. For example, by using a tri-block copolymer of chain A-chain C-chain B (the molecular weight of the chain C is sufficiently low as compared with those of the chains A and B), there is made a phase-separated body in which phases A and B constitute a three-dimensional bicontinuous phase separation structure, and continuous phase C in sheet form is present at the interface between the phases A and B. In this case, if an electron-conducting phase is used as the phase A, a hole-conducting phase, as the phase B, and a light-emitting phase, as the phase C, this phase-separated body can have a structure equivalent to the laminated structure of a device composed of three layers laminated. Similarly, if a tetra-block copolymer is used, there can be obtained a structure equivalent to a laminated structure composed of four layers. Thus, in the device of the present invention, a structure equivalent to a laminated structure composed of some layers, each having a thickness of few nanometers to several tens nanometers can be formed in a medium in a self-developing manner. Therefore, a bicontinuous structure composed of four continuous phase is formed by the use of a tetra-block copolymer composed of, for instance, chain A-chain C1-chain C2- chain B (the molecular weight of each block: chain A, chain B >> chain C1, chain C2). In this case, conducting phases are respectively used as the phase A (phase made of an aggregate of chains A) and the phase B (phase made of an aggregate of chains B); a hole-transporting phase is used as the chain C1; and an electron-transporting light-emitting phase is used as the chain C2. This device has a structure equivalent to that of a two-layered EL device in which the phases C1 and C2, thin films, are laminated. Moreover, even if such a phase-separated body is made into any shape, the above relation remains unchanged. Namely, if the phase-separated body of the present invention is used, it is possible to easily produce a device comparable to conventional devices of film-laminated type whose production requires complicated steps. Moreover, degrees of freedom are increased in terms of the shape of the device; for example, the device can also be made into fibrous one. Further, sufficiently high performance can be obtained even when comb-shaped electrodes are used instead of ordinary parallel-plate electrodes. In addition, the interf acial area is increased, and the efficiency of injection of carriers between phases is increased due to the electric field concentration effect produced by the nano structure; it thus becomes possible to attain remarkable improvement in performance.

Organic Transistor Device

An organic transistor device is produced by using a bicontinuous structure composed of three continuous phases that is formed by the use of, for example, a tri-block copolymer. For example, by the use of a tri-block copolymer of chain A-chain C-chain B, there is obtained a phase-separated body in which phases A and B constitute a three-dimensional bicontinuous phase separation structure, and continuous phase C in sheet form is present at the interface between the phases A and B. In this case, a conducting phase is used as the phase A; a semiconducting phase, as the phase B; and an insulating phase, as the phase C. By providing a gate electrode, a pair of source electrodes, and a drain electrode to this phase-separated body, it is possible to obtain a transistor device.

In the production of such a device, when a homopolymer of the chain A is applied to the surface of the gate electrode so that the electrode will have high affinity for the phase A, and a homopolymer of the chain B is applied to the surfaces of the source electrodes and that of the drain electrode so that these electrodes will have affinity for the phase B, the gate electrode is selectively brought into contact with the phase A, and the source electrodes and the drain electrode are selectively brought into contact with the phase B. A transistor of such a bicontinuous phase-separated body has a structure in which the gate electrode penetrates the semiconductor layer to form a three-dimensional network. The practical gate width can thus be increased relative to the gate length, and a great ON electric current can be obtained.

Further, in a bicontinuous structure composed of phases A and B made from a di-block copolymer of chain A and chain B, if the interface between the phases A and B is made Schottky junction, it is also possible to obtain a Schottky-gate-type transistor device.

In this case, it is preferable to make the structure of the device as follows: paired comb-shaped electrodes whose teeth are fitted into each other, and an electrode in sheet form are disposed with the former facing the latter, and the space between the former and the latter is filled with the phase-separated body. In the formation of such a structure, it is preferable to connect the electrodes as follows: one of the comb-shaped electrodes is brought into contact with the conducting phase and the insulating phase, and this one is used as a gate electrode; while the other comb-shaped electrode and the electrode in sheet form are brought into contact with the semiconductor phase and the insulating phase, and these are used as a source electrode and a drain electrode, respectively.

Capacitor

A capacitor is produced by using a bicontinuous structure composed of three continuous phases, formed by the use of, for example, a tri-block copolymer. For example, by the use of a tri-block copolymer composed of chain A-chain C-chain B (the chain A and the chain B are incompatible with each other), there is obtained a phase-separated body in which phases A and B constitute a three-dimensional bicontinuous phase separation structure, and continuous phase C in sheet form is present at the interface between the phases A and B. In this case, a conducting phase is used as the phase A; a semiconducting phase, as the phase B; and an insulating phase, as the phase C. To this phase-separated body, an anode and a cathode are provided. At this time, a homopolymer of the chain A is applied to the surface of the anode in order to impart, to the anode, high affinity for the phase A; and a homopolymer of the chain B is applied to the surface of the cathode in order to impart, to the cathode, high affinity for the phase B. By doing so, the anode is selectively brought into contact with the phase A, while the cathode is selectively brought into contact with the phase B. For the phase A, there may be used any of such hole conductors as doped polyanilines, polypyrroles, polythiophenes, and polyvinyls having as side chains oligomers of these compounds. For the phase B, there may be used any of electron-donating polymers such as poly-2-vinylpyridine and polyvinylcarbazole, and CT complexes or complex salts composed of polymeric polycations and 7,7,8,8-tetracyanoquinone dimethane (hereinafter referred to as TCNQ). For the insulating phase, there may be used any of polysiloxanes, polylmides, and metal complex polymers containing, in their main or side chains, metal complexes such as aluminum complexes, or metal chelate structures.

Similarly, it is possible to use a tri-block copolymer of chain A-chain C-chain B (the molecular weight of the chain C is sufficiently low as compared with those of the chains A and B, the chain A and the chain B are incompatible with each other). In this case, conducting polymer chains are used as the chains A and B, and an ion-conducting polymer chain such as polyethylene oxide or polyvinyl alcohol is used as the chain C. A double-layered electric capacitor in which the phases A and B serve as porous electrodes can be obtained if a tri-continuous structure in which a host electrolytic salt is dissolved in the phase C is formed by casting a solution of the host electrolytic salt when a phase-separated body is made. At this time, it is preferable to use an aprotic polymer such as polyethylene oxide as the ion-conducting polymer chain because, when such a polymer used, the resulting capacitor has increased dielectric strength. In the phase C, if not only a host electrolytic salt is dissolved, but also any of water, esters such as carbonates, for example, ethylene carbonate, ethers such as ethylene glycol, and non-aqueous polar solvents such as sulfolane and methylene chloride is swelled, increased ionic conductivity can be obtained. Such a capacitor has reduced internal resistance at the electrode site without undergoing decrease in capacity. An increased electric current can thus be obtained at the time of charging or discharging.

Further, a bicontinuous phase-separated body composed of a P-type semiconductor phase and an N-type semiconductor phase may be formed, and electrodes may be disposed so that a reverse bias can be produced. Furthermore, by using a hole- or electron-transporting polymer chain as the chain A, and an ion-conducting polymer chain, as the chain B. there may be formed a double-layered electric capacitor or electrochemical photoelectric conversion device. In this case, it is preferable, as mentioned above, to make the structure of the device a tri-continuous structure because the internal resistance of the device can be reduced, and the output current can thus be increased. To make an electrochromic device, a tri-block copolymer of chain A-chain C-chain B (the chains A and B are incompatible with each other) is used. In this case, a semiconducting polymer chain whose color is changed by reversible oxidation-reduction reaction is used as at least one of the chains A and B; a conducting polymer, as the other chain; and an ion-conducting polymer ring, as the chain C. It is possible to obtain an electrochromic device that shows high speed of response if a tri-continuous structure in which a host electrolytic salt is dissolved in the phase C is formed, when a phase-separated body is formed, by casting a solution of the host electrolytic salt. Such a device shows increased speed of response as compared with, for example, a device having a bicontinuous structure composed of a semiconductor phase and an ion-conducting phase, obtained by connecting a pair of electrodes to a bicontinuous phase-separated body composed of chain A and chain B (the chain A is a semiconducting polymer chain whose color is changed by reversible oxidation-reduction reaction, and the chain B is an ion-conducting polymer chain; the chain A and the chain B are incompatible with each other). Namely, a device having such a semiconductor phase-ion-conductor phase bicontinuous structure has an area of the interface between the semiconductor phase and the ion-conductor phase as large as the interfacial area in the tricontinuous structure, however, the spacing between the interface and the electrode that is connected to the ion-conducting phase is large, so that this bicontinuous structure unfavorably brings about increase in internal resistance and decrease in speed of response. On the contrary, in the tricontinuous structure, the ion-conductor phase formed at the interface between the semiconductor phase and the conducting phase has a thickness of only several tens nanometers, so that sufficiently high speed of response can be attained. Further, when a polymer chain that can be doped to n-type is used as one of the chains A and B, and a polymer chain that can be doped to p-type is used as the other chain; or when polymer chains that can be doped to both n-type and p-type are used for the chains A and B, an electrochromic device of push-pull type is obtained. By doing so, multi-color display is realized, and, in addition, improvement in response and contrast can be attained. Such a device structure of push-pull type can also be used for polymeric secondary batteries, and can provide secondary batteries having high capacity and low internal resistance.

Thus, by using block copolymers, it is possible to form a variety of functional devices having bicontinuous or tricontinuous phase separation structures. These devices, especially devices having bicontinuous phase separation structures, can of course be produced even by the use of graft copolymers, star-type block copolymers, etc. Further, although it is not always necessary to form these devices by the use of materials derived from polymers, it is preferable to use polymers when easiness of production and that of control of phase separation structure are taken into consideration.

As mentioned hereinbefore, the present invention can provide functional devices that have large interfacial areas and that scarcely suffer separation of phases at the interface between them to show good durability. Further, the functional devices of the present invention can be produced, for example, by the simple application of polymeric materials. The present invention can provide multi-layered device structures that have never been known until now, such as a laminated structure composed of multiple layers, for example, a functional device having a phase-separated body composed of three continuous phases. These structures can never be obtained from, for example, conventional blend systems of polymeric materials. Further, since the devices of the invention use conducting or semiconducting phases in which electrons or holes serve as carriers, they show high speed of response as compared with similar devices using ion-conducting phases. In addition, even in the case of a device using an ion-conducting phase, the ion transport distance is short if the device has a tricontinuous structure; the speed of response can thus be improved significantly.

A functional device according to the third embodiment of the present invention, characterized by comprising a laminated structure in which conducting, semiconducting or ion-conducting phases A and B in sheet form are alternately laminated, and at least one pair of electrodes that are disposed so that they interpenetrate into the laminate at 4 points or more and penetrate the lamination surfaces can generally be produced by the use of the phase separation of a polymer such as a block or graft copolymer as in the case of the aforementioned devices having bicontinuous structures. By making the volume fraction of one of the two phases from 40 to 60%, preferably from 45 to 55%, it becomes possible to cause phase separation to form a lamellar structure. The laminated structure of the functional device of the present invention can thus be obtained. By imparting high affinity for a specific phase to the surface of an electrode that interpenetrates into the laminated structure as in the case of those devices having bicontinuous structures, it is possible to attain selective connection of the electrode to the phase.

In such a laminated structure, if an n-type semiconductor phase and a p-type semiconductor phase are used as the phase A and the phase B, respectively, the resulting structure can be used for light-emitting devices, photoelectric convention devices, and the like. Further, if conducting or semiconducting phases are used as the phases A and B, an ion-conducting phase, as the phase C, it is possible to obtain electrochromic devices, secondary batteries, etc. Furthermore, if an insulting phase is used as the phase C, capacitors and the like can be produced.

The electrode is preferably in the form of fibrous-electrode-woven mesh or cloth. A composite material composed of such mesh- or cloth-like electrodes and the above-described laminate is usually made into a sheet to obtain a device having the laminated structure of the present invention. When a polymeric material made of a block or graft copolymer is used, the mesh- or cloth-like electrodes may be impregnated with a solution of this polymeric material to obtain the composite material. Alternatively, the polymeric material is made into a sheet; the electrode is sandwiched between two pieces of this sheet; and the resultant is hot-pressed to obtain the composite material. By annealing this composite material preferably at a temperature above the glass transition temperature of the polymeric material, it is possible to attain good phase separation, and, if necessary, selective phase-electrode connection.

Further, it is also possible to make an electrode by dispersing or percolating, in the laminate, conducting or semiconducting, preferably needle-like or linear fine particles, for example. Preferable examples of such fine particles include carbon fine particles such as needle-like carbon and carbon nano cube, transparent conducting fine particles such as indium tin oxanoide (hereinafter referred to as ITO), and metallic fine particles. Further, an electrode, preferably a dendrite- or fractal-type electrode, can be separated out in the laminate by such a technique as plating. For light-emitting devices or photoelectric conversion devices, it is preferable to use ultrafine particles whose sizes are in the order of several tens nanometers in order to prevent light particularly in the ultraviolet to visible regions from being scattered.

Each electrode penetrates layers that are generally 20% or more, preferably 50% or more, more preferably 80% or more, and most preferably 95% or more of the whole layers constituting the laminate. In addition, each electrode penetrates, at 4 points or more, at least one interface between two layers laminated. The number of points of penetration is preferably 10 or more, more preferably 100 or more, and most preferably 1,000 or more.

The mean spacing between the points of penetration is preferably not more than 10,000 times, more preferably not more than 1,000 times, more preferably not more than 100 times, and most preferably not more than 10 times the mean value of the thickness of the layer A and that of the layer B.

By making the electrode penetrate the laminate complicatedly, it becomes possible to attain reduction in the internal resistance of devices, and increase in speed of response.

There is no particular limitation on the thickness of each layer in the laminated structure; however, the thickness is preferably from 2 to 100 nm, more preferably from 5 to 50 nm, and most preferably from 10 to 20 nm. From the viewpoint of the performance of devices, such as speed of response and internal resistance, and to obtain good phase separation structures, the thickness of each layer should be made within the above-described range.

The number of layers in the laminated structure is made 4 or more, preferably 100 or more, more preferably 500 or more, and most preferably 1,000 or more in order to ensure a sufficiently large interfacial area.

As mentioned in detail hereinbefore, the present invention can provide device structures that have never been attained until now, and by the use of these device structures, it is possible to obtain functional devices that are remarkably improved in performance. Moreover, these device structures can simply be produced at low cost. The present invention thus has great industrial value.

EXAMPLES

The present invention will now be explained specifically by referring to the following examples. However, the present invention is not limited by or limited to these examples.

In the following examples, solvents were subjected to the following treatment before being used for living or radical polymerization: after placing a drying agent such as metallic sodium in each solvent, the solvent was refluxed, and distilled to obtain a dehydrated solvent; and oxygen gas was then removed from this solvent by means of freeze deaeration. Living polymerization and radical polymerization were conducted in an atmosphere of argon gas under a pressure of 4 atoms.

Example 1

Light-Emitting Device

<Synthesis of Di-block Copolymer>

A di-block copolymer represented by formula (III) shown below was synthesized by a living anion polymerization method. Masked disilene (IIIa) and methacrylic ester (IIIb) were used as monomers, and sec-butyl lithium was used as an initiator. By successively adding the monomers to THF solvent, the synthesis was conducted at a reaction temperature of −78° C. Weight-average molecular weight Mw of the copolymer obtained=37,600, Mw/Mn=1.1; molecular weight of polysilane unit=26,000; and molecular weight of polymethacrylic ester (IIIb) unit=11,600.

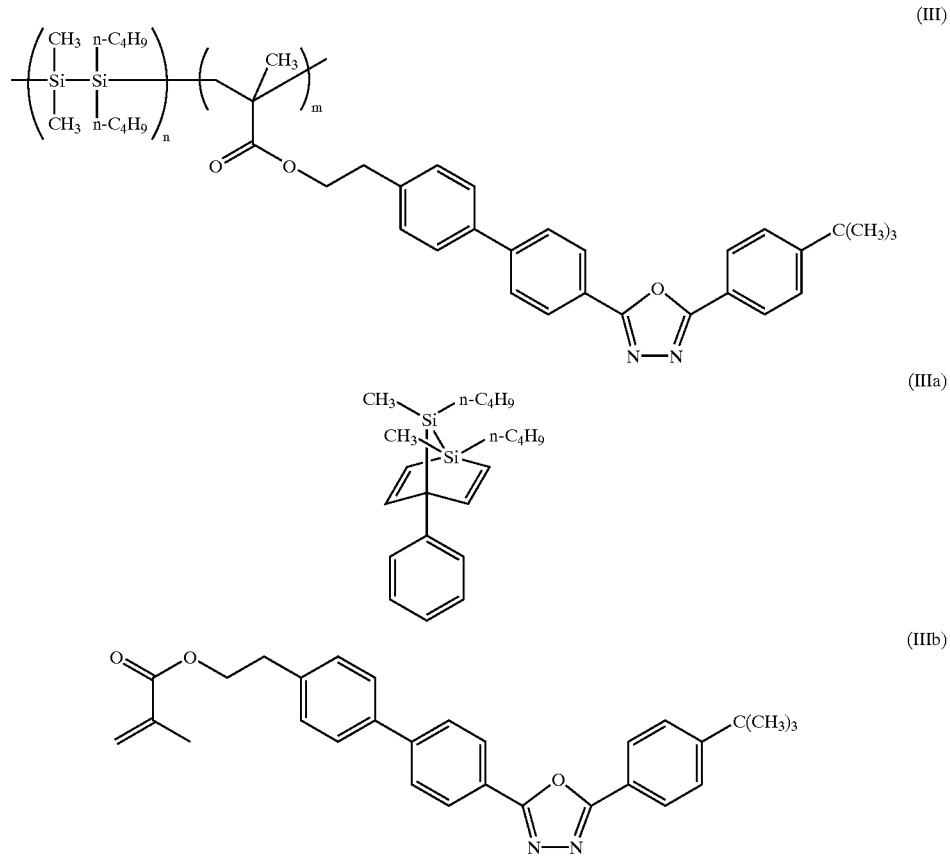

<Production of Light-Emitting Device>

An ITO electrode (sheet resistance 15 Ω/) of 10 mm×10 mm was made, as an anode, on one surface of a glass substrate. A toluene solution of the di-block copolymer (III) was applied to the ITO electrode to form a layer of the di-block copolymer (III) with a thickness of 100 nm.

In a stream of argon, this di-block copolymer (III) layer was heated at 150° C. for 8 hours to cause phase separation. Thereafter, aluminum was vacuum-deposited on the di-block copolymer (III) layer under a reduced pressure of 1×10$^{-6}$ torr to form an aluminum cathode having a thickness of 50 nm and dimensions of 8 mm×8 mm, thereby producing a light-emitting device. The di-block copolymer (III) layer after being thermally treated was subjected to TEM observation. As a result, it was found that an OBDD phase separation structure having openings whose mean diameter was 16 nm had been formed.

Comparative Example 1

An ITO electrode (sheet resistance 15 Ω/) of 10 mm×10 mm was made, as an anode, on one surface of a glass substrate. A toluene solution of a 13:6 (weight basis) mixture of polysilane (Mw=26,000) obtained by homopolymerizing masked disilene (IIIa) and polymethacrylic ester (Mw=12,000) obtained by homopolymerizing methacrylic ester (IIIa) was applied to the ITO electrode to form a layer with a thickness of 100 nm.

On this polymer layer, aluminum was vacuum-deposited under a reduced pressure of $1\times10^{-6}$ torr to form an aluminum cathode having a thickness of 50 nm and dimensions of 8 mm×8 mm. Thereafter, the resultant was heated at 150° C. for 8 hours in a stream of argon to cause phase separation in the polymer layer, thereby producing a light-emitting device.

Example 2

A tri-block copolymer represented by formula (IV) shown below was synthesized by a living anion polymerization method. Methacrylic ester (IVa) and ethylene oxides (IVb) and (IVc) respectively represented by the formulas shown below were used as monomers; and diphenymethyl lithium was used as an initiator along with lithium chloride. By successively adding the monomers to THF solvent, the synthesis was conducted at a reaction temperature of −78° C. Weight-average molecular weight Mw of the copolymer obtained=44,700, Mw/Mn=1.2; molecular weight of poly(methacrylic ester (IVa)) unit=11,000; molecular weight of poly(ethylene oxide (IVb)) unit=22,800; and molecular weight of poly(ethylene oxide (IVc)) unit=10,900.

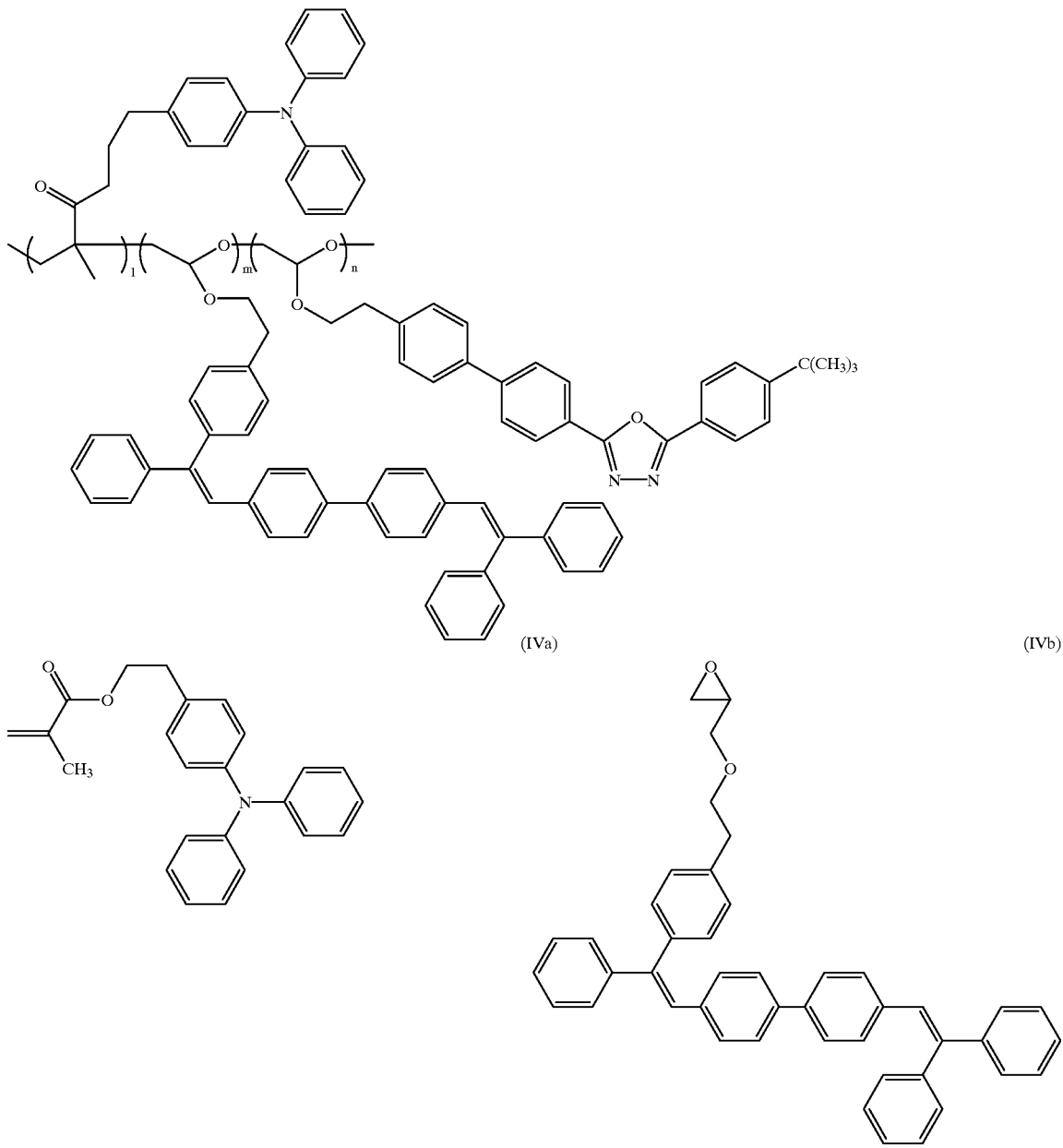

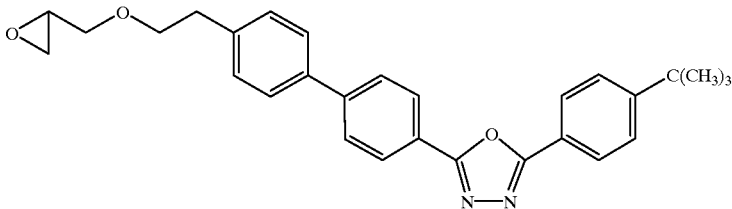

(IVc)

An ITO electrode (sheet resistance 15 Ω/) of 10 mm×10 mm was made, as an anode, on one surface of a glass substrate useful for light-emitting devices. A toluene solution of the tri-block copolymer (IV) was applied to the ITO electrode to form a layer of the tri-block copolymer (IV) with a thickness of 100 nm.

Aluminum was vacuum-deposited on this layer of the tri-block copolymer (IV) under a reduced pressure of $1\times10^{-6}$ torr to form an aluminum cathode having a thickness of 50 nm and dimensions of 8 mm×8 mm. Thereafter, the resultant was heated at 150° C. for 8 hours in a stream of argon to cause phase separation in the tri-block copolymer (IV) layer, thereby producing a light-emitting device. The tri-block copolymer (IV) layer after being thermally treated was subjected to TEM observation. As a result, it was found that an OTDD phase separation structure having openings whose mean diameter was 17 nm had been formed.

Comparative Example 2

An ITO electrode (sheet resistance 15 Ω/) of 10 mm×10 mm was made, as an anode, on one surface of a glass substrate. A toluene solution of a mixture of polymethacrylic ester obtained by homopolymerizing methacrylic ester (IVa), polyethylene oxide obtained by homopolymerizing ethylene oxide (IVb), and polyethylene oxide obtained by homopolymerizing ethylene oxide (IVc), the weight ratio of these three polymers in the mixture being the same as the monomer ratio in the tri-block copolymer (IV) in Example 2, was applied to the ITO electrode to form a polymer layer with a thickness of 100 nm.

On this polymer layer, aluminum was vacuum-deposited under a reduced pressure of $1\times10^{-6}$ torr to form an aluminum cathode having a thickness of 50 nm and dimensions of 8 mm×8 mm. Thereafter, the resultant was heated at 150° C. for 8 hours in a stream of argon to cause phase separation in the polymer layer, thereby producing a light-emitting device.

The external quantum efficiency ψ of each light-emitting device thus fabricated was determined. The external quantum efficiency ψ can be obtained in the following manner: the light-emitting device is driven by the application of a constant direct voltage of 7 V; the value of the electric current I (mA/cm²) measured at this time, and the number of photons detected at the outside of the device are divided by the number of carriers that have passed through the device. The results were as shown in Table 1.

TABLE 1

|  | I (mA/cm²) | ψ (%) |
|---|---|---|
| Example 1 | 7 | 0.10 |
| Example 2 | 6 | 0.17 |
| Comp. Ex. 1 | 11 | 0.02 |
| Comp. Ex. 2 | 15 | 0.01 |

The data shown in Table 1 demonstrate that it is possible to improve luminous efficiency by making the structure of a light-emitting device the bicontinuous or tricontinuous structure of the present invention.

Example 3

Light-Emitting Device
<Synthesis of Graft Copolymer>

Azo bisisobutylonitrile (AIBN) was added, as a radical polymerization initiator, to a solution prepared by dissolving, in THF, a cyclodiene derivative (Va) and a macromer (Vb) respectively represented by the formulas shown below. This mixture was heated at 60° C. for 120 hours in an argon atmosphere to synthesize a graft copolymer represented by formula (V) shown below by means of radical polymerization. Weight-average molecular weight Mw of the copolymer obtained=21,000, Mw/Mn=2.1; molecular weight of polycyclodiene unit=5,900; and molecular weight of macromer (Vb) unit=15,100.

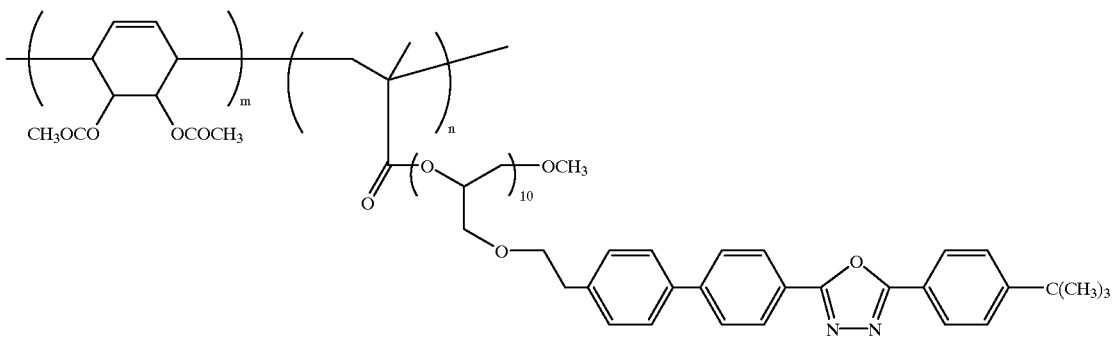

(V)

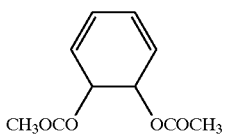

(Va)

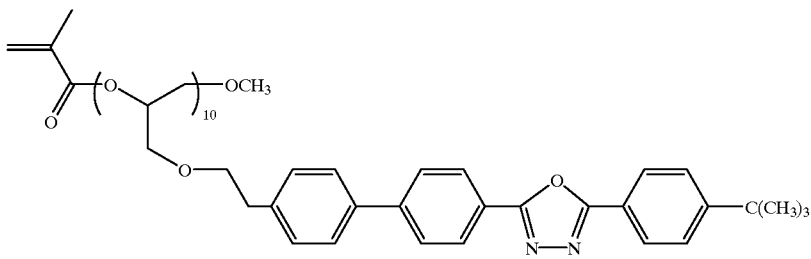

(Vb)

<Production of Light-Emitting Device>

An ITO electrode (sheet resistance 15 Ω/) of 10 mm×10 mm was made, as an anode, on one surface of a glass substrate. A toluene solution of the graft copolymer (V) was applied to the ITO electrode to form a layer of the graft copolymer (V) with a thickness of 200 nm.

Under a vacuum of 1×10$^{-8}$ torr, this layer was heated at 150° C. for 8 hours, and then at 200° C. for 2 hours to convert the polycyclodiene chain into polyparaphenylene chain. The graft copolymer (V) layer after being thermally treated was subjected to TEM observation. As a result, it was found that a bicontinuous phase separation structure having openings whose mean diameter was 8 nm had been formed.

After the thermal treatment, aluminum was vacuum-deposited on the graft copolymer (V) layer under a reduced pressured of 1×10$^{-6}$ torr to form an aluminum cathode having a thickness of 50 nm and dimensions of 8 mm×8 mm, thereby producing a light-emitting device. The external quantum efficiency ψ of this light-emitting device was as high as 0.1%.

Example 4

<Production of Light-Emitting Device by Reactive Processing>

Two different telechelic polymers represented by formula (VI) and formula (VII) shown below were respectively synthesized by radical polymerization using a functional chain transfer agent. Weight-average molecular weight Mw of telechelic polymer (VI) having amino end group=12,100, Mw/Mn=1.9; and weight-average molecular weight Mw of telechelic polymer (VII) having carboxyl end group=4,700, Mw/Mn=1.8.

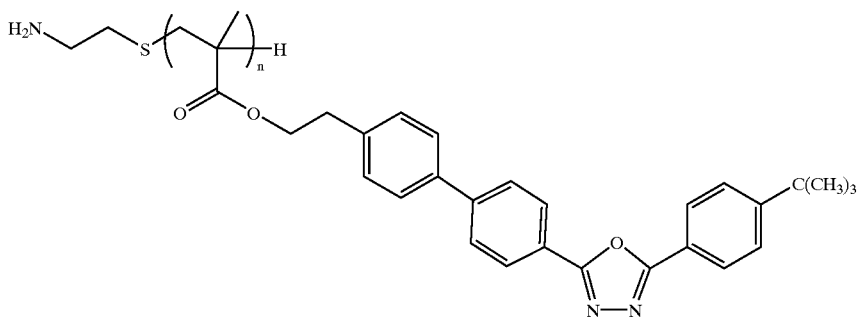

(VI)

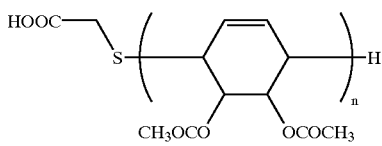

(VII)

(Formula 6)

An ITO electrode (sheet resistance 15 Ω/) of 10 mm×10 mm was made, as an anode, on one surface of a glass substrate. An equimolar solution of the telechelic polymer (VI) having amino end group and the telechelic polymer (VII) having carboxylic acid end group was applied to the ITO electrode to form a layer of the polymer mixture with a thickness of 200 nm.

This layer was heated at 150° C. for 24 hours in a stream of argon to cause phase separation in the polymer mixture layer. The polymer mixture layer after being thermally treated was subjected to TEM observation. As a result, it was found that a bicontinuous phase separation structure of Gyroid type, having openings whose mean diameter was 6 nm had been formed.

After the thermal treatment, aluminum was vacuum-deposited on the polymer mixture layer under a reduced pressured of $1 \times 10^{-6}$ torr to form an aluminum cathode having a thickness of 50 nm and dimensions of 8 mm×8 mm, thereby producing a light-emitting device. The external quantum efficiency ψ of this light-emitting device was as high as 0.2%.

Example 5

Electrochromic Device
<Synthesis of Tri-block Copolymer>

A di-block copolymer represented by formula (VIII) shown below was synthesized by a living anion polymerization method. A trithiophene derivative (VIIIa) having the formula shown below and ethylene oxide were used as monomers; and α-stilyl lithium was used as an initiator along with lithium chloride. By successively adding the monomers to THF solvent, the synthesis was conducted at a reaction temperature of −78° C.

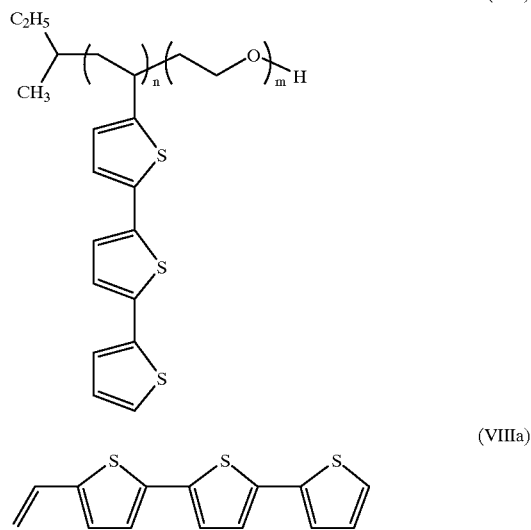

(VIII)

(VIIIa)

Reaction between this di-block copolymer (VIII) and excess 4-aminobenzoic acid was carried out to replace the hydroxyl group present at the end of the polyoxyethylene chain with 4-aminobenzoic ester group. This di-block copolymer whose end had been esterified and ferric chloride were dissolved in chloroform. To this solution, a chloroform solution of aniline was added dropwise to make polyaniline chain grow from the amino group present at the end ester site, and a trithiophene derivative polymer-polyethylene oxide-polyaniline tri-block copolymer was obtained as a precipitate. Weight-average molecular weight Mw of the copolymer obtained=70,400, Mw/Mn=1.6; molecular weight of polytrithiophene derivative=18,400; molecular weight of polyoxyethylene unit=33,800; and molecular weight of polyaniline unit=18,200. The tri-block copolymer obtained was subjected to de-doping treatment, and then dissolved in N-methyl-2-pyrrolidone. This solution was cast to form a 20-mm square tri-block copolymer film with a thickness of 50 μm.

An ITO substrate was coated with polythiophene by an electrolytic polymerization method. Separately, a copper-mesh electrode (20 mm square) was coated with polyaniline by an electrolytic polymerization method. The above-formed tri-block copolymer film was sandwiched between the ITO substrate and the copper-mesh electrode, and the resultant was hot-pressed, and thermally treated at 150° C. for 8 hours in a stream of argon.

Thereafter, this laminate was immersed in a 1M aqueous solution of sulfuric acid for 2 hours, and then sealed by a PET film to obtain an electrochromic device of the present invention. The cross-section of the tri-block copolymer film in this device was subjected to TEM observation. As a result, it was confirmed that the film had a tricontinuous structure in which both of the trithiophene derivative polymer phase and the polyaniline phase were three-dimensional network continuous phases, each having openings whose mean diameter was approximately 30 nm, and the polyethylene oxide phase was present at the interface between these two phases. It was also confirmed that the trithiophene derivative polymer phase and the polyaniline phase were respectively in contact only with either the triphenylene derivative layer formed on the surface of the ITO electrode, or the polyaniline layer formed on the surface of the copper-mesh electrode. Namely, the two phases were separated from each other by the polyethylene oxide phase, and it was not observed such a state that they were in direct contact.

When this electrochromic device was driven at an operating voltage of −1.5 to 1.5 V, it showed reversible electrochromism. The speed of response of this device was approximately 200 μsec; this speed is higher than that of conventional devices of film-laminated type. Further, under these conditions, it was possible to drive the device $3 \times 10^8$ cycles or more before the contrast in color change became 50% of the initial contrast; this device was thus found to be good in durability.

Example 6

Polymeric Battery
<Synthesis of Tri-block Copolymer>

An end-modified-type polyethylene oxide (IXa) having the formula shown below and 2-aminoanisole-4-sulfonic acid were dissolved in aqueous ammonia by stirring. To this solution was added dropwise an aqueous solution of ammonium peroxodisulfate at room temperature. Thereafter, the mixture was stirred at room temperature for 15 hours. The reaction product was filtered off, washed, and dried to obtain a di-block copolymer.

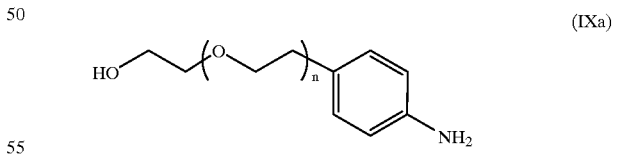

(IXa)

This di-block copolymer was reacted with excess 4-aminobenzoic acid to replace the hydroxyl group present at the end of the polyoxyethylene chain with 4-aminobenzoic ester, thereby synthesizing a di-block copolymer having amino end group.

Next, this di-block copolymer having amino end group and ammonium persulfate were dissolved in water by stirring. To this solution was added dropwise an aqueous hydrochloric acid solution of aniline at −5° C. over 1 hour, and the mixture was then stirred at −5° C. for 10 hours. The solid product precipitated was filtered off, and subjected to de-doping treatment using 5% aqueous ammonia. Thereafter, the resultant was subjected to extraction with chloroform to obtain a tri-block copolymer of (poly(2-aminoanisole-4-sulfonic aid))-(polyethylene oxide)-(polyaniline). Weight-average molecular weight Mw of the copolymer obtained=180,000, Mw/Mn=1.7; molecular weight of poly(2-aminoanisole-4-sulfonic acid) unit=44,000; molecular weight of poly(ethylene oxide) unit=90,000; and molecular weight of poly(aniline) unit=46,000.

The tri-block copolymer obtained was dissolved in N-methyl-2-pyrrolidone, and this solution was cast to form a 20-mm square film of the tri-block copolymer, having a thickness of 50 μm.

The surface of one of paired copper-mesh electrodes (20 mm square) was coated with poly(2-aminoanisole-4-sulfonic acid), and the surface of the other was coated with polyaniline. The above-formed tri-block copolymer film was sandwiched between these copper-mesh electrodes, and the resultant was hot-pressed, and thermally treated at 150° C. for 8 hours in a stream of argon.

Thereafter, the laminate obtained was immersed in a 1M aqueous solution of sulfuric acid for 2 hours, and then sealed by an aluminum-laminated film to obtain a polymeric battery. The cross-section of the tri-block copolymer film in this device was subjected to TEM observation. As a result, it was confirmed that the film had a tricontinuous structure in which both of the poly(2-aminoanisole-4-sulfonic acid) phase and the polyaniline phase were three-dimensional network continuous phases, each having openings whose mean diameter was approximately 70 nm, and the polyethylene oxide phase was present at the interface between these two phases. It was also confirmed that the poly(2-aminoanisole-4-sulfonic acid) phase and the polyaniline phase were respectively in contact only with either one of the poly(2-aminoanisole-4-sulfonic acid) layer and the polyaniline layer formed on the surfaces of the copper-mesh electrodes and that the two phases were separated from each other by the polyethylene oxide phase, such a state that they were in direct contact being not observed at all. By driving this polymeric battery, it was confirmed that this battery was capable of reversibly charging and discharging.

Example 7

Capacitor
<Synthesis of Tri-block Copolymer>

An end-modified-type polysiloxane having formula (Xa) shown below and 2-aminoanisole-4-sulfonic acid were dissolved in a mixed solution of aqueous ammonia and dimethylformamide by stirring. To this solution was added dropwise an aqueous solution of ammonium peroxodisulfate at room temperature, and the mixture was stirred at room temperature for 15 hours. The reaction solution was added dropwise to excess ethanol, and the mixture was stirred. The reaction product reprecipitated was filtered off, washed, and dried to obtain a di-block copolymer (X) having the formula shown below (in this formula, the polyaniline moiety is shown as if it were composed only of phenylenediamine structure; however, quinodiimine structure is also present in the polyaniline moiety, in practice).

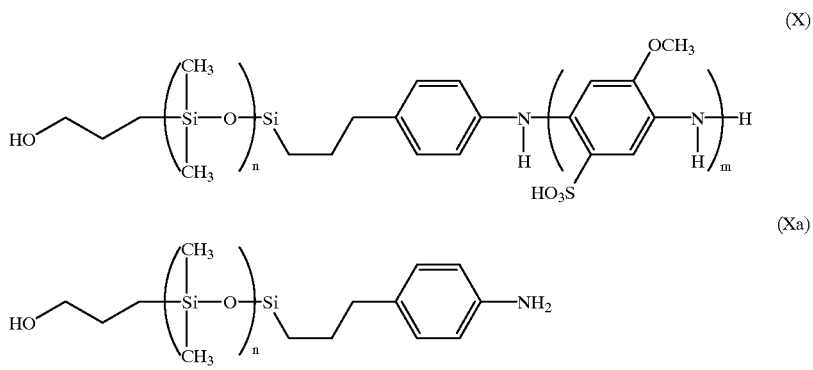

This di-block copolymer (X) was reacted with excess 4-aminobenzoic acid to replace the hydroxyl group present at the end of the polysiloxane chain with 4-aminobenzoic ester, thereby synthesizing a di-block copolymer having amino end group.

This di-block copolymer having amino end group and ammonium persulfate were dissolved in water by stirring. To this solution was added dropwise an aqueous hydrochloric acid solution of aniline at –5° C. over 1 hour, and the mixture was stirred at –5° C. for 20 hours. The solid product precipitated was filtered off, and subjected to de-doping treatment using 5% aqueous ammonia. Thereafter, the resultant was subjected to extraction with chloroform to obtain a tri-block copolymer of (polyaniline)-(polydimethylsiloxane)-(poly(2-aminoanisole-4-sulfonic aid)). Weight-average molecular weight Mw of the copolymer obtained=276,000, Mw/Mn=1.5; molecular weight of poly(2-aminoanisole-4-sulfonic acid) unit=56,400; molecular weight of poly(dimethylsiloxane) unit=165,600, and molecular weight of poly(aniline) unit=54,000.

The tri-block copolymer obtained was dissolved in N-methyl-2-pyrrolidone, and this solution was cast to form a 20-mm square film of the tri-block copolymer, having a thickness of 50 μm.

Next, the surface of one of paired copper-mesh electrodes (20 mm square) was coated with poly(2-aminoanisole-4-sulfonic acid), and the surface of the other was coated with polyaniline. The above-formed tri-block copolymer film was sandwiched between these copper-mesh electrodes, and the resultant was hot-pressed, and thermally treated at 150° C. for 8 hours in a stream of argon. Thereafter, the laminate obtained was immersed in a 1M aqueous solution of sulfuric acid for 2 hours, and then sealed by an aluminum-laminated film to obtain a capacitor device of the present invention. The cross-section of the tri-block copolymer film in this device was subjected to TEM observation. As a result, it was confirmed that the film had a tricontinuous structure in which both of the poly(2-aminoanisole-4-sulfonic acid) phase and the polyaniline phase were three-dimensional network continuous phases, each having openings whose mean diameter was approximately 100 nm, and the polydimethylsiloxane phase was present at the interface between these two phases. It was also confirmed that the poly(2-aminoanisole-4-sulfonic acid) phase and the polyaniline phase were respectively in contact only with either one of the poly(2-aminoanisole-4-sulfonic acid) layer and the polyaniline layer formed on the surfaces of the copper-mesh electrodes and that the two phases were separated from each other by the polydimethylsiloxane phase, such a state that they were in direct contact being not observed at all.

The capacity of this capacitor device was measured with an impedance analyzer. As a result, the capacity was as great as 216 $\mu$F at 120 Hz. The leakage current was only $10^{-8}$ A or less at a voltage of 3 V or less. It was thus found that the polydimethylsiloxane phase serving as an insulating film had extremely few electrical defects.

Example 8

Capacitor
<Synthesis of Tri-block Copolymer>

An end-modified-type polysiloxane represented by formula (Xa) shown below and ammonium persulfate were dissolved in dimethylformamide by stirring. To this solution was added dropwise an aqueous hydrochloric acid solution of aniline at 0° C. over a period of 1 hour, and the mixture was stirred at 0° C. for 10 hours. The reaction solution was then added dropwise to excess water, and the mixture was stirred. The solid product precipitated was filtered off, and subjected to de-doping treatment using 5% aqueous ammonia. The emeraldine derivative polymer produced was dissolved in 1,3-dimethyl-3,4,5,6-tetrahydro-2(1H)-pyrimidinone (DMPU). To this solution was added sodium hydride, thereby replacing the N-position of the emeraldine derivative polymer with sodium. Subsequently, extremely excess 1-hexyl bromide was added to the above mixture, and reaction was carried out for 1 week to obtain a di-block copolymer (XI) having the formula shown below (in this formula, the polyaniline moiety is shown as if it were composed only of phenylenediamine structure; however, quinodiimine structure having no hexyl group is also present in the polyaniline moiety, in practice).

precipitated was filtered off, and subjected to de-doping treatment using 5% aqueous ammonia. Thereafter, the resultant was subjected to extraction with chloroform to obtain a tri-block copolymer of (polyaniline)-(polydimethylsiloxane)-(poly(N-hexyl polyaniline). Weight-average molecular weight Mw of the copolymer obtained=96,000, Mw/Mn=1.8; molecular weight of poly (N-hexylaniline) unit=18,200; molecular weight of poly (dimethylsiloxane) unit=59,500; and molecular weight of poly(aniline) unit=183,000.

The tri-block copolymer obtained was dissolved in N-methyl-2-pyrrolidone, and this solution was cast to form a 20-mm square film of the tri-block copolymer, having a thickness of 50 $\mu$m.

Next, the surface of one of paired copper-mesh electrodes (20 mm square) was coated with poly(N-hexylaniline), and the surface of the other was coated with polyaniline. The above-formed tri-block copolymer film was sandwiched between these copper-mesh electrodes, and the resultant was hot-pressed, and thermally treated at 150° C. for 8 hours in a stream of argon.

Thereafter, the laminate obtained was immersed in a 1M aqueous solution of sulfuric acid for 2 hours, and then sealed by an aluminum-laminated film to obtain a capacitor device. The cross-section of the tri-block copolymer film in this device was subjected to TEM observation. As a result, it was confirmed that the film had a tricontinuous structure in which both of the poly(N-hexylaniline) phase and the polyaniline phase were three-dimensional network continuous phases, each having openings whose mean diameter was approximately 40 nm, and the polydimethylsiloxane phase was present at the interface between these two phases. It was also confirmed that the poly(N-hexylaniline) phase and the polyaniline phase were respectively in contact only with either one of the poly(N-hexylaniline) layer and the polyaniline layer formed on the surfaces of the copper-mesh electrodes and that the two phases were separated from each other by the polydimethylsiloxane phase, such a state that they were in direct contact being not observed at all.

The capacity of this capacitor device was measured with an impedance analyzer. As a result, the capacity was as great as 223 $\mu$F at 120 Hz. The leakage current was only $10^{-8}$ A or less at a voltage of 3 V or less. It was thus found that the polydimethylsiloxane phase serving as an insulating film had extremely few electrical defects.

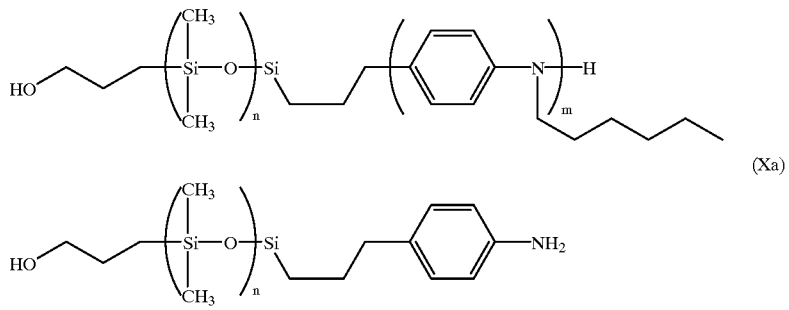

This di-block copolymer (XI) was reacted with excess 4-aminobenzoic acid to replace the hydroxyl group present at the end of the polysiloxane chain with 4-aminobenzoic ester, thereby synthesizing a di-block copolymer having amino end group.

This di-block copolymer having amino end group and ammonium persulfate were dissolved in water by stirring. To this solution was added dropwise an aqueous hydrochloric acid solution of aniline at −5° C. over 1 hour, and the mixture was stirred at −5° C. for 10 hours. The solid product Example 9

Photoelectric Conversion Device
<Synthesis of Graft Copolymer>

Methacrylic ester (XIIa), acrylic amide (XIIb), and perylene macromer (XIIc) respectively represented by the formulas shown below were dissolved in THF solvent. To this solution was added AIBN as a radical polymerization initiator, and the mixture was heated at 60° C. for 60 hours in an argon atmosphere to synthesize a graft copolymer (XII)

represented by the formula shown below by means of radical polymerization. Weight-average molecular weight Mw of the copolymer obtained=30,400, Mw/Mn=2.1; molecular weight of copolymer chain composed of methacrylic ester (XIIa) and acrylic amide (XIIb)=21,200; and molecular weight of perylene macromer (XIIc)unit=9,200.
(XII)
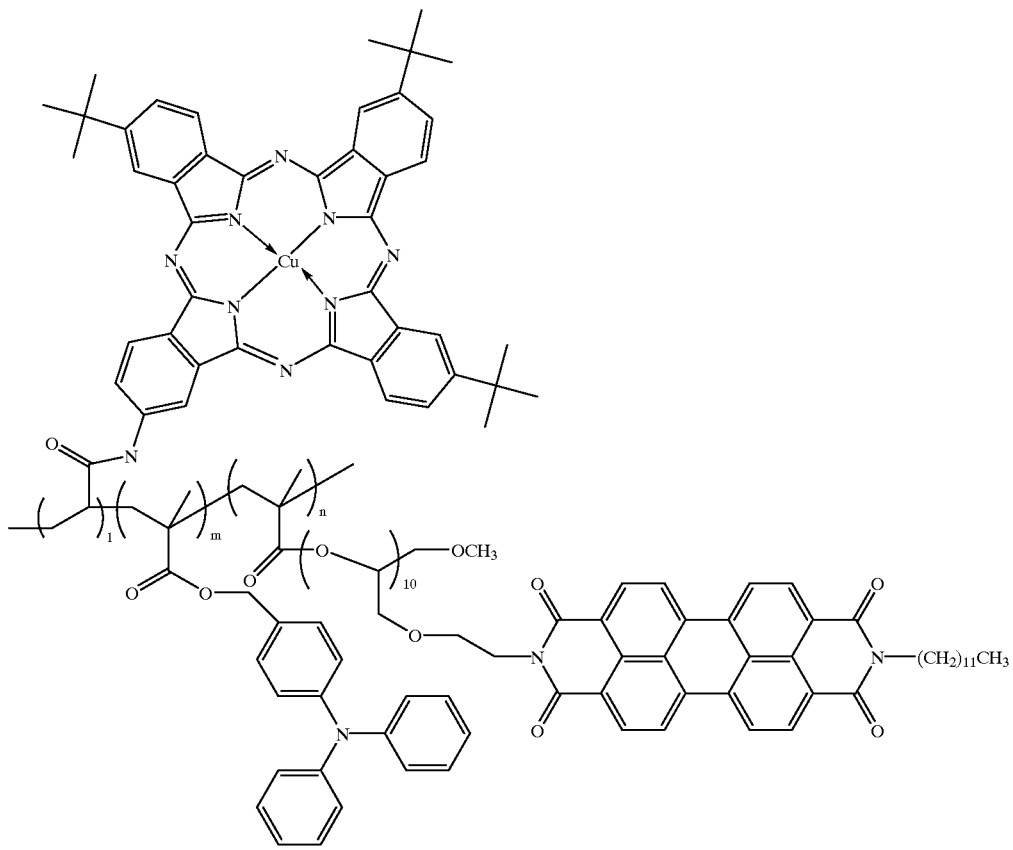
(XIIa)
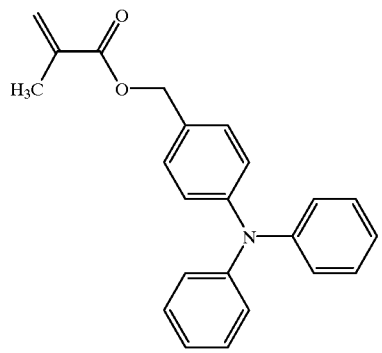
(XIIb)
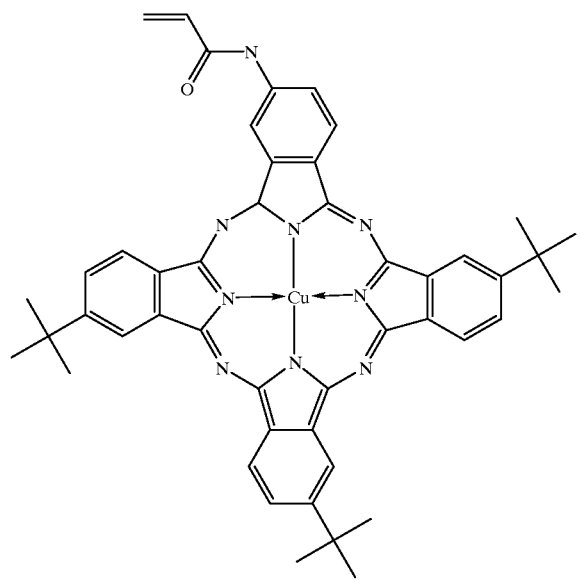

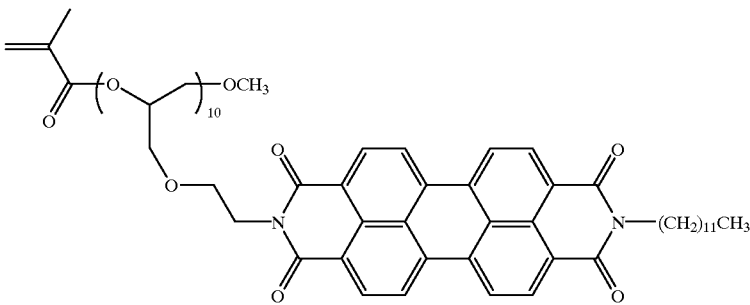

(XIIc)

<Production of Photoelectric Conversion Device>

An ITO electrode (sheet resistance 15 Ω/) of 10 mm×10 mm was made on a glass substrate. A solution of the graft copolymer (XII) was applied to the ITO electrode to form a layer of the graft copolymer (XII) with a thickness of 200 nm.

Aluminum was then vacuum-deposited on this graft copolymer (XII) layer under a reduced pressure of $1 \times 10^{-6}$ torr to form an aluminum cathode having a thickness of 50 nm and dimensions of 10 mm×10 mm, thereby producing a photoelectric conversion device. The graft copolymer (XII) layer was subjected to TEM observation. As a result, it was confirmed that there had been formed a bicontinuous phase separation structure with openings whose mean diameter was approximately 13 nm.

To this photoelectric conversion device, light was applied at AM 1 (100 mWcm$^{-2}$). As a result, the device showed energy conversion efficiency as relatively high as 0.5%.

Example 10

Transistor

<Synthesis of Tri-block Copolymer>

A di-block copolymer (X) was synthesized in the same manner as in Example 7. This di-block copolymer (X) was reacted with excess 4-aminobenzoic acid to replace the hydroxyl group present at the end of the polysiloxane chain with 4-aminobenzoic ester, thereby synthesizing a di-block copolymer having amino end group. Weight-average molecular weight Mw of the copolymer obtained=119,000, Mw/Mn=1.5; molecular weight of poly(2-aminoanisole-4-sulfonic acid) unit=34,500; and molecular weight of poly(dimethylsiloxane) unit=84,500.

<Production of Transistor Device>

A 50-nm thick white gold film was laminated to a glass substrate by a sputtering method, and a predetermined resist pattern was then formed on this white gold film. By using this resist pattern as a mask, the white gold film was etched by means of reactive ion etching (RIE) to obtain a pair of comb-shaped electrodes. Each one of these paired comb-shaped electrodes had 25 teeth, each having a width of 100 μm and a length of 10 mm, the teeth of one of the electrodes and those of the other being alternately aligned with the spacing between two teeth being 10 μm. On one of the comb-shaped electrodes (hereinafter referred to as comb-shaped gate electrode), aniline was eletrolytically polymerized in the presence of polystyrene sulfonic acid. A composite film of polyaniline and polystyrene sulfonic acid was thus formed on this comb-shaped gate electrode.

Next, a mixture of the di-block copolymer having amino end group previously synthesized and a telechelic polymer having carboxylic acid end group (XIII) (weight-average molecular weight Mw=34,600) having the formula shown below was applied to the entire surface of the comb-shaped electrodes, air-dried at room temperature, and heated at 80° C. for 1 hour and then at 150° C. for 8 hours in a stream of argon to form a layer of the polymer mixture with a thickness of 300 nm. To this polymer mixture layer, a 10-nm thick film of a polyparaphenylene precursor (XIIIa) having the following formula was applied, and thermally treated at 200° C. for 2 hours under a vacuum of $1 \times 10^{-8}$ torr. Thereafter, a gold electrode (hereinafter referred to as drain electrode) in the shape of a square of 10 mm=10 mm was formed by means of vacuum deposition so that this electrode and the comb-shaped electrode pattern would overlap each other, whereby a transistor device was produced. The polymer mixture layer after being thermally treated was subjected to TEM observation. As a result, it was confirmed that a tricontinuous phase separation structure having openings whose mean diameter was 70 nm had been formed.

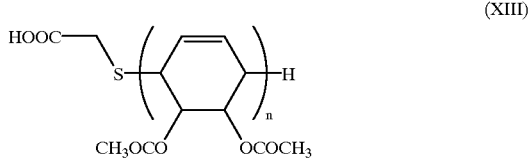

(XIII)

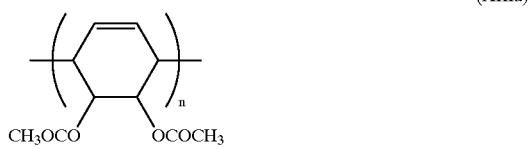

(XIIIa)

This transistor device was driven by the use of one of the paired comb-shaped electrodes, the one not being used as the gate electrode, as a source electrode. As a result, the ON-OFF ratio of the electric current ($I_{ON}/I_{OFF}$) between the source electrode and the drain electrode was $10^4$ or more, and the density of output current from the drain electrode at the time of ON was 0.1 A/cm$^2$. The transistor device thus showed good performance.

Example 11

Capacitor Having Lamellar Structure

<Synthesis of Tri-block Copolymer>

The procedure of Example 8 was repeated except that the molecular weights of the polyaniline, polydimethylsiloxane and poly(N-hexylaniline) used in Example 8 were respectively changed, whereby a tri-block copolymer of (polyaniline)-(polydimethylsiloxane)-(poly(N-hexylaniline)) was synthesized. Weight-average molecular weight Mw of the copolymer obtained=61,000, Mw/Mn=1.8; molecular weight of poly(aniline) unit=25,000; molecular weight of poly(dimethylsiloxane) unit=12,000; and molecular weight of poly(N-hexylaniline) unit=24,000.

Gold was plated at a thickness of 0.5 μm on the surfaces of two copper wires, each having a diameter of 30 μm. One of the copper wires was coated with a 0.1-μm thick polyaniline film, and the other was coated with a 0.1-μm thick poly(N-hexylaniline) film by an electrolytic polymerization method. To the copper wire coated with polyaniline, an N-methyl-2-pyrrolidone solution of the tri-block copolymer, in which 20% by weight of $SiO_2$ fine particles with a mean particle diameter of approximately 1 μm had been dispersed, was applied to form a layer of the tri-block copolymer with a thickness of approximately 5 μm.

By using these two copper wires as warp and weft, cloth-like copper mesh was obtained. The warp and weft were separately gathered to respectively form terminals to obtain a 20-mm square copper mesh electrode with two terminals. This copper mesh electrode was impregnated with an N-methyl-2-pyrrolidone solution of the tri-block copolymer, and then air-dried, whereby a copper mesh electrode impregnated with the tri-block copolymer, the thickness of the copolymer film formed being approximately 150 μm, was obtained. This electrode was thermally treated at 150° C. for 8 hours in a stream of argon. Thereafter, it was immersed in a 1M aqueous sulfuric acid solution for 2 hours, vacuum-dried at 100° C. for 30 minutes, and then sealed by an aluminum-laminated film to obtain a capacitor of the present invention. The cross-section of this device was subjected to TEM observation. As a result, it was confirmed that the poly(N-hexylaniline) phase and the polyaniline phase constituted a lamellar phase and that the polydimethylsiloxane phase was formed at the interface between the two phases. The poly(N-hexylaniline) phase and the polyaniline phase respectively had a thickness of approximately 50 nm. By the combination of TEM observation and optical microscopic observation, it was confirmed that the copper mesh electrode penetrated both the poly(N-hexylaniline) phase and the polyaniline phase at 20 points or more. It was also confirmed that the poly(N-hexylaniline) phase and the polyaniline phase were in contact only with either one of the poly(N-hexylaniline) layer and the polyaniline layer that had been formed on the surfaces of the copper wires and that these two phases had been separated from each other by the polydimethylsiloxane phase.

The capacity of this capacitor was measured with an impedance analyzer. As a result, the capacity was as high as 180 μF at 120 Hz. Further, the leak current was only $10^{-8}$ A or less when the voltage was 3V or less. It was thus found that the polydimethylsiloxane phase serving as an insulating film had extremely few electrical defects.

Example 12

Phase-Separated Body
<Synthesis of Tri-block Copolymer>

A tri-block copolymer (XIV) represented by the formula shown below was synthesized by successively adding a styrene derivative (XIVa) and a silsesquioxane derivative (XIVb) respectively represented by the formulas shown below, and acrylonitrile, using α-stilyl lithium as an initiator along with lithium chloride. Weight-average molecular weight Mw of the copolymer obtained=30,000, Mw/Mn=1.3; molecular weight of poly(styrene derivative (XIVa)) unit=7,500; molecular weight of poly(silsesquioxane derivative (XIVb)) unit=15,000; and molecular weight of poly(acrylonitrile) unit=7,600.

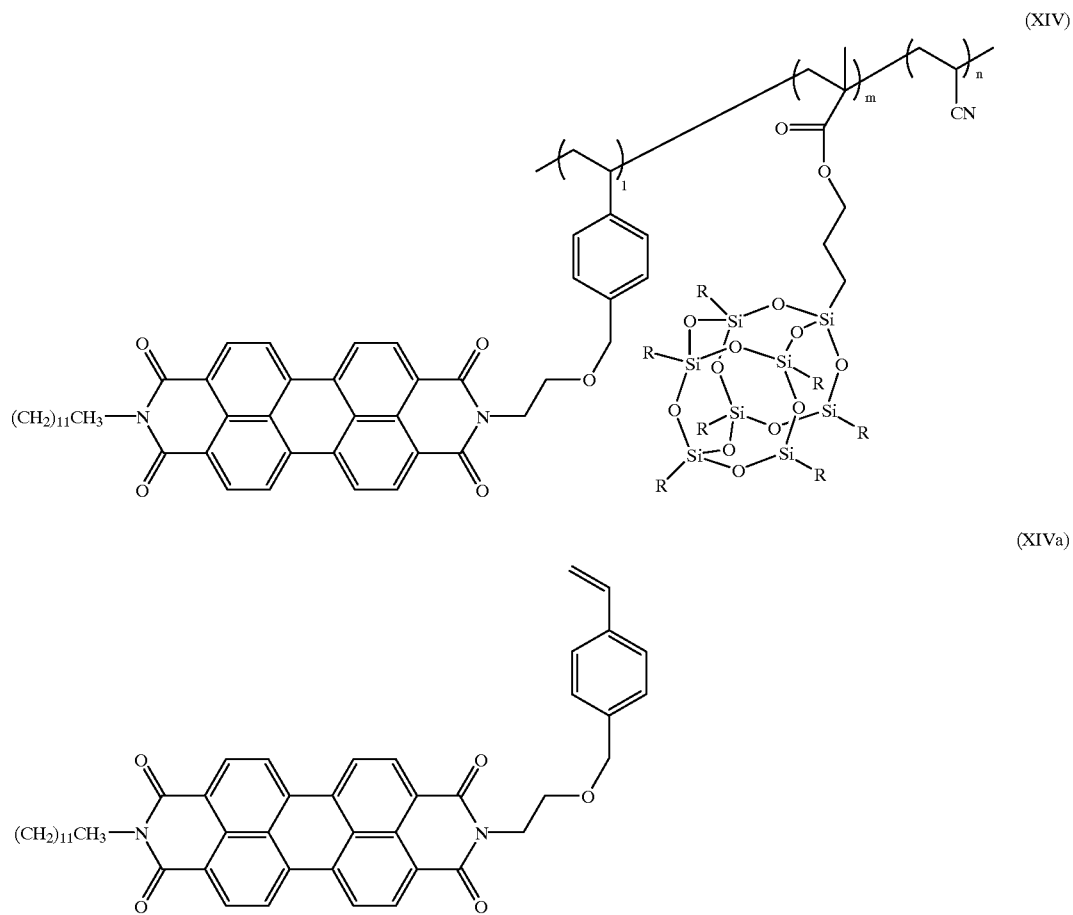

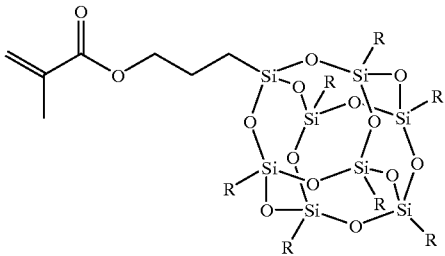 (XIVb)

Wherein all Rs represent -cyclo-$C_6H_{11}$.

<Production of Phase-Separated Body>

A solution of the tri-block copolymer (XIV) was cast, and air-dried at room temperature for 1 week to form a film of the tri-block copolymer (XIV). This film was irradiated with 1 gray of β-rays, and then thermally treated at 200° C. for 1 hour in the air and for 5 hours in a stream of argon. Thereafter, this film was further subjected to thermal treatment at 400° C. for 5 hours in a stream of argon.

Both of the poly(styrene derivative (XIVa)) phase and the poly(acrylonitrile) phase in the polymer (XIV) film after being thermally treated were found to be semiconducting ladder polymers, and the poly(silsesquioxane derivative (XIVb)) phase was found to have a $SiO_2$ analogous structure. Further, it was confirmed by TEM observation that there had been formed an OTDD structure in which the ladder polymer phases derived from the poly(styrene derivative (XIVa)) phase and the polyacrylonitrile phase respectively had three-dimensional networks, and the $SiO_2$ analogous structure phase derived from the poly(silsesquioxane derivative (XIVb)) was present at the interface between these two phases.

What is claimed is:

1. A functional device which comprises a multi-component multi-phase type polymeric shaped material containing, at least, chains A and B that are hole- or electron-conducting polymer chains, wherein phase A that is an aggregate of the chains A and phase B that is an aggregate of the chains B constitute a three-dimensional bicontinuous nano phase separation structure, and, at the same time, are chemically bonded at the interface between them, and which has such a device structure that electrode terminals are respectively connected to the phase A and the phase B.

2. The functional device according to claim 1, wherein the chain A and the chain B are combined by covalent bond.

3. The functional device according to claim 1, wherein the chain A and the chain B constitute, by chemical bonding, a copolymer selected from di-block copolymers of A-B type, tri-block copolymers of A-B-A type, and tri-block copolymers of B-A-B type.

4. The functional device according to claim 1, wherein phase C, a continuous phase that is an aggregate of chains C, polymer chains different from the chains A and B, is present at the interface between the phases A and B.

5. The functional device according to claim 1, wherein the weight-average molecular weight of the block composed of the chain A and that of the block composed of the chain B are respectively 10,000 or more.

6. The functional device according to claim 1, wherein the ratio of the weight-average molecular weight Mw to the number-average molecular weight Mn (Mw/Mn) of the polymer chain that constitutes the chain A or B is 1.15 or less.

7. The functional device according to claim 1, wherein the electrode terminal connected to the phase A is connected to the phase B through the phase A, and the electrode terminal connected to the phase B is connected to the phase A through the phase B.

8. The functional device according to claim 1, wherein the three-dimensional bicontinuous nano phase separation structure has openings whose mean diameter is 0.1 μm or less.

9. The functional device according to claim 1, wherein the three-dimensional bicontinuous nano phase separation structure is one selected from the group consisting of OBDD structures, Gyroid structures, lamellacathenoid structures, T-surface structures, P-surface structures, D-surface structures, G-surface structures, and disordered structures.

10. A functional device which comprises, at least, hole- or electron-conducting phases A and B, wherein the phase A and the phase B constitute at least one three-dimensional bicontinuous phase nano separation structure selected from the group consisting of OBDD structures and Gyroid structures, and which has such a device structure that electrode terminals are respectively connected to the phase A and the phase B.

11. The functional device according to claim 10, wherein the phase A and the phase B are combined by covalent bond.

12. The functional device according to claim 10, wherein insulating, hole-conducting, electron-conducting or ion-conducting phase C is present at the interface between the phases A and B, and the phases A, B and C constitute an OTDD structure.

13. The functional device according to claim 10, wherein the electrode terminal connected to the phase A is connected to the phase A directly, and the electrode terminal connected to the phase B is connected to the phase B directly.

14. The functional device according to claim 1, wherein the three-dimensional bicontinuous nano phase separation structure has openings whose mean diameter is 0.1 μm or less.

15. A multi-component multi-phase type polymeric shaped material comprising, at least, chains A and B that are hole- or electron-conducting polymer chains, wherein phase A that is an aggregate of the chains A and phase B that is an aggregate of the chains B constitute a three-dimensional bicontinuous nano phase separation structure, and, at the same time, are chemically bonded at the interface between them.

16. The multi-component multi-phase type polymeric shaped material according to claim 15, wherein the chain A and the chain B are combined by covalent bond.

17. The multi-component multi-phase type polymeric shaped material according to claim 15, wherein the chain A and the chain B constitute, by chemical bonding, a copolymer selected from di-block copolymers of A-B type, tri-block copolymers of A-B-A type, and tri-block copolymers of B-A-B type.

18. The multi-component multi-phase type polymeric shaped material according to claim 15, wherein phase C, a continuous phase that is an aggregate of chains C, polymer chains different from the chains A and B, is present at the interface between the phases A and B.

19. The multi-component multi-phase type polymeric shaped material according to claim 15, wherein the weight-average molecular weight of the block composed of the chain A and that of the block composed of the chain B are respectively 10,000 or more.

20. The multi-component multi-phase type polymeric shaped material according to claim 15, wherein the ratio of the weight-average molecular weight Mw to the number-average molecular weight Mn (Mw/Mn) of the polymer chain that constitutes the chain A or B is 1.15 or less.

21. The multi-component multi-phase type polymeric shaped material according to claim 15, wherein the three-dimensional bicontinuous nano phase separation structure has openings whose mean diameter is 0.1 $\mu$m or less.

22. The multi-component multi-phase type polymeric shaped material according to claim 15, wherein the three-dimensional bicontinuous nano phase separation structure is one selected from the group consisting of OBDD structures, Gyroid structures, lamellacathenoid structures, T-surface structures, P-surface structures, D-surface structures, G-surface structures, and disordered structures.

23. The multi-component multi-phase type polymeric shaped material according to claim 15, wherein insulating, hole-conducting, electron-conducting or ion-conducting phase C is present at the interface between the phases A and B, and the phases A, B and C constitute an OTDD structure.

* * * * *

UNITED STATES PATENT AND TRADEMARK OFFICE
CERTIFICATE OF CORRECTION

PATENT NO.     : 6,391,471 B1
DATED          : May 21, 2002
INVENTOR(S)    : Hiraoka et al.

It is certified that error appears in the above-identified patent and that said Letters Patent is hereby corrected as shown below:

<u>Title page,</u>
Item [73], Assignee, should read
-- [73]   Assignee:     Kabushiki Kaisha Toshiba, Kawasaki-shi (JP) --

Signed and Sealed this

Tenth Day of September, 2002

Attest:

Attesting Officer

JAMES E. ROGAN
*Director of the United States Patent and Trademark Office*